United States Patent
Myung et al.

(10) Patent No.: US 8,291,282 B2
(45) Date of Patent: Oct. 16, 2012

(54) APPARATUS AND METHOD FOR ENCODING AND DECODING CHANNEL IN A COMMUNICATION SYSTEM USING LOW-DENSITY PARITY-CHECK CODES

(75) Inventors: Seho Myung, Suwon-si (KR); Hong-Sil Jeong, Seoul (KR); Kyung-Joong Kim, Pohang-si (KR); Hyun-Koo Yang, Seoul (KR); Kyeong-Cheol Yang, Seoul (KR); Jae-Yoel Kim, Suwon-si (KR); Hwan-Joon Kwon, Suwon-si (KR); Yeon-Ju Lim, Seoul (KR); Sung-Ryul Yun, Suwon-si (KR); Hak-Ju Lee, Incheon (KR)

(73) Assignees: Samsung Electronics Co., Ltd (KR); Postech Academy Industry Foundation (KR)

( * ) Notice: Subject to any disclaimer, the term of this patent is extended or adjusted under 35 U.S.C. 154(b) by 785 days.

(21) Appl. No.: 12/388,202

(22) Filed: Feb. 18, 2009

(65) Prior Publication Data

US 2009/0210767 A1    Aug. 20, 2009

(30) Foreign Application Priority Data

| Feb. 18, 2008 | (KR) | ......................... | 10-2008-0014649 |
| Feb. 29, 2008 | (KR) | ......................... | 10-2008-0019373 |
| Nov. 25, 2008 | (KR) | ......................... | 10-2008-0117264 |
| Jan. 30, 2009 | (KR) | ......................... | 10-2009-0007662 |

(51) Int. Cl.
*H03M 13/00* (2006.01)

(52) U.S. Cl. ........................................................ 714/752

(58) Field of Classification Search .......... 714/749–758, 714/762, 774, 786, 788, 799–802, 821
See application file for complete search history.

(56) References Cited

U.S. PATENT DOCUMENTS

| 7,162,684 | B2 * | 1/2007 | Hocevar ....................... 714/800 |
| 7,506,238 | B2 * | 3/2009 | Hocevar ....................... 714/781 |
| 7,814,393 | B2 * | 10/2010 | Kyung et al. ................. 714/758 |
| 7,890,844 | B2 | 2/2011 | Jeong et al. |
| 2004/0054960 | A1 | 3/2004 | Eroz et al. |

(Continued)

FOREIGN PATENT DOCUMENTS

EP    1 513 259    3/2005

(Continued)

OTHER PUBLICATIONS

MacKay, "Good Error-Correcting Codes Based on Very Sparse Matrices", XP-002143042, IEEE Transactions on Information Theory, vol. 45, No. 2, Mar. 1, 1999.

(Continued)

*Primary Examiner* — Nadeem Iqbal
(74) *Attorney, Agent, or Firm* — The Farrell Law Firm, P.C.

(57) ABSTRACT

An apparatus and method for generating a parity-check matrix of a Low-Density Parity-Check (LDPC) code are provided. Parameters for designing the LDPC code are determined, and a first parity-check matrix of a quasi-cyclic LDPC code is formed according to the determined parameters. A second parity-check matrix is created through the elimination of a predetermined portion of a parity part in the first parity-check matrix, and a third parity-check matrix is created by rearranging the second parity-check matrix.

23 Claims, 11 Drawing Sheets

U.S. PATENT DOCUMENTS

| | | | |
|---|---|---|---|
| 2004/0185886 A1 | 9/2004 | Matsumoto | |
| 2005/0078765 A1 | 4/2005 | Jeong et al. | |
| 2005/0235191 A1 | 10/2005 | Kim et al. | |
| 2005/0271160 A1 | 12/2005 | Eroz et al. | |
| 2005/0283708 A1 | 12/2005 | Kyung et al. | |
| 2006/0156181 A1 | 7/2006 | Ha et al. | |
| 2006/0156183 A1 | 7/2006 | Kim et al. | |
| 2007/0113147 A1 | 5/2007 | Hong et al. | |
| 2007/0226583 A1 | 9/2007 | Kim et al. | |
| 2008/0104474 A1 | 5/2008 | Gao et al. | |
| 2008/0126917 A1* | 5/2008 | Huang | 714/801 |
| 2009/0313520 A1* | 12/2009 | Chung et al. | 714/751 |
| 2010/0325511 A1* | 12/2010 | Oh et al. | 714/752 |
| 2012/0189079 A1 | 7/2012 | Taylor et al. | |

FOREIGN PATENT DOCUMENTS

| | | |
|---|---|---|
| EP | 1 528 686 | 5/2005 |
| EP | 1 653 629 | 5/2006 |
| JP | 2003-244109 | 8/2003 |
| JP | 2005-312034 | 11/2005 |
| JP | 2006-100941 | 4/2006 |
| JP | 2006-157926 | 6/2006 |
| JP | 2007-036776 | 2/2007 |
| JP | 2008-515342 | 5/2008 |
| JP | 2009-153109 | 7/2009 |
| KR | 1020060047842 | 5/2006 |
| KR | 1020070035283 | 3/2007 |
| KR | 1020070046476 | 5/2007 |
| KR | 1020070054088 | 5/2007 |
| RU | 2 327 287 | 6/2008 |
| WO | WO 2004/006442 | 1/2004 |
| WO | WO 2006/019217 | 2/2006 |
| WO | WO 2006/055086 | 5/2006 |
| WO | WO 2006/079081 | 7/2006 |
| WO | WO 2009/025092 | 2/2009 |

OTHER PUBLICATIONS

Dielissen et al., "Low Cost LDPC Decoder for DVB-S2", IEEE Conference on Design, Automation and Test in Europe, vol. 2, Mar. 6, 2006.

Digital Video Broadcasting: "Frame Structure Channel Coding and Modulation for a Second Generation Digital Terrestrial Television Broadcasting System (DVB-T2)", DVB Document A122r1, XP-002667650, Jan. 2008.

"Digital Video Broadcasting (DVB); Second Generation Framing Structure, Channel Coding and Modulation Systems for Broadcasting, Interactive Services, News Gathering and other Broadband Satellite Applications", European Broadcasting Unit, ETSI EN 302 307 V1.1.2, Jun. 1, 2006.

\* cited by examiner

| $P^{a_{11}}$ | $P^{a_{12}}$ | $P^{a_{13}}$ | | $P^{a_{1(b-1)}}$ | $P^{a_{1b}}$ | I | 0 | 0 | | 0 | |
|---|---|---|---|---|---|---|---|---|---|---|---|
| $P^{a_{21}}$ | $P^{a_{22}}$ | $P^{a_{23}}$ | | $P^{a_{2(b-1)}}$ | $P^{a_{2b}}$ | I | I | 0 | ⋯ | 0 | 0 |
| $P^{a_{31}}$ | $P^{a_{32}}$ | $P^{a_{33}}$ | ⋯ | $P^{a_{3(b-1)}}$ | $P^{a_{3b}}$ | 0 | I | I | | 0 | 0 |
| $P^{a_{41}}$ | $P^{a_{42}}$ | $P^{a_{43}}$ | | $P^{a_{4(b-1)}}$ | $P^{a_{4b}}$ | 0 | 0 | I | ⋱ | 0 | 0 |
| | ⋮ | | ⋱ | ⋮ | | | ⋮ | | ⋱ | ⋱ | |
| $P^{a_{c1}}$ | $P^{a_{c2}}$ | $P^{a_{c3}}$ | ⋯ | $P^{a_{c(b-1)}}$ | $P^{a_{cb}}$ | 0 | 0 | 0 | 0 | I | I |

FIG.7

APPARATUS AND METHOD FOR ENCODING AND DECODING CHANNEL IN A COMMUNICATION SYSTEM USING LOW-DENSITY PARITY-CHECK CODES

PRIORITY

This application claims priority under 35 U.S.C. §119(a) to a Korean Patent Application filed in the Korean Intellectual Property Office on Feb. 18, 2008 and assigned Serial No. 10-2008-0014649, a Korean Patent Application filed in the Korean Intellectual Property Office on Feb. 29, 2008 and assigned Serial No. 10-2008-0019373, a Korean Patent Application filed in the Korean Intellectual Property Office on Nov. 25, 2008 and assigned Serial No. 10-2008-0117264, and a Korean Patent Application filed in the Korean Intellectual Property Office on Jan. 30, 2009 and assigned Serial No. 10-2009-0007662, the disclosures of which are incorporated herein by reference.

BACKGROUND OF THE INVENTION

1. Field of the Invention

The present invention relates generally to a communication system using Low-Density Parity-Check (LDPC) codes, and more particularly, to a channel encoding/decoding apparatus and method for generating LDPC codes of a particular type.

2. Description of the Related Art

In wireless communication systems, link performance significantly decreases due to various noises in channels, a fading phenomenon, and Inter-Symbol Interference (ISI). Therefore, in order to realize high-speed digital communication systems requiring high data throughput and reliability, such as next-generation mobile communication, digital broadcasting, and portable internet, it is necessary to develop a technology for overcoming noises, fading, and ISI. Recently, an intensive study was conducted relating to the use of an error-correcting code in increasing communication reliability by efficiently recovering distorted information.

An LDPC code, which was first introduced by Gallager in the 1960s, has been underutilized due to its complex implementation that could not be resolved by past technology. However, turbo code, which was discovered by Berrou, Glavieux, and Thitimajshima in 1993, shows the performance approximating Shannon's channel limit. Thus, research has been conducted on iterative decoding and graph-based channel encoding along with analyses on performance and characteristic of the turbo code. Due to this research, the LDPC code was restudied in the late 1990s, which proved that LDPC code has performance approximating Shannon's channel limit if it undergoes decoding by applying iterative decoding based on a sum-product algorithm on a Tanner graph (a special case of a factor graph) corresponding to the LDPC code.

The LDPC code is typically represented using a graph representation technique, and many characteristics can be analyzed through the methods based on graph theory, algebra, and probability theory. Generally, a graph model of channel codes is useful for description of codes. By mapping information on encoded bits to vertexes in the graph and mapping relations between the bits to edges in the graph, it is possible to consider a communication network in which the vertexes exchange predetermined messages through the edges. This makes it possible to derive a natural decoding algorithm. For example, a decoding algorithm derived from a trellis, which can be regarded as a kind of graph, can include the well-known Viterbi algorithm and a Bahl, Cocke, Jelinek and Raviv (BCJR) algorithm.

The LDPC code is generally defined as a parity-check matrix, and can be expressed using a bipartite graph, which is referred to as a Tanner graph. In the bipartite graph vertexes constituting the graph are divided into two different types, and the LDPC code is represented by the bipartite graph composed of vertexes, some of which are called variable nodes and the other of which are called check nodes. The variable nodes are mapped one-to-one to the encoded bits.

With reference to FIGS. 1 and 2, a description will be made of a graph representation method for the LDPC code.

FIG. 1 shows an example of a parity-check matrix $H_1$ of the LDPC code composed of 4 rows and 8 columns. Referring to FIG. 1, since the number of columns is 8, an LDPC code generates a length-8 codeword, and the columns are mapped to 8 encoded bits.

FIG. 2 is a diagram illustrating a Tanner graph corresponding to $H_1$ of FIG. 1.

Referring to FIG. 2, the Tanner graph of the LDPC code is composed of 8 variable nodes $x_1$ (202), $x_2$ (204), $x_3$ (206), $x_4$ (208), $x_5$ (210), $x_6$ (212), $x_7$ (214) and $x_8$ (216), and 4 check nodes 218, 220, 222 and 224. An $i^{th}$ column and a $j^{th}$ row in the parity-check matrix $H_1$ of the LDPC code are mapped to a variable node $x_i$ and a $j^{th}$ check node, respectively. In addition, a value of 1, i.e., a non-zero value, at the point where an $i^{th}$ column and a $j^{th}$ row in the parity-check matrix $H_1$ of the LDPC code cross each other, indicates that there is an edge between the variable node $x_i$ and the $j^{th}$ check node on the Tanner graph as shown in FIG. 2.

In the Tanner graph of the LDPC code, a degree of the variable node and the check node is defined as the number of edges connected to each respective node, and the degree is equal to the number of non-zero entries in a column or row corresponding to the associated node in the parity-check matrix of the LDPC code. For example, in FIG. 2, degrees of the variable nodes $x_1$ (202), $x_2$ (204), $x_3$ (206), $x_4$ (208), $x_5$ (210), $x_6$ (212), $x_7$ (214) and $x_8$ (216) are 4, 3, 3, 3, 2, 2, 2 and 2, respectively, and degrees of check nodes 218, 220, 222 and 224 are 6, 5, 5 and 5, respectively. In addition, the numbers of non-zero entries in the columns of the parity-check matrix $H_1$ of FIG. 1, which correspond to the variable nodes of FIG. 2, are equal to their degrees 4, 3, 3, 3, 2, 2, 2 and 2. The numbers of non-zero entries in the rows of the parity-check matrix $H_1$ of FIG. 1, which correspond to the check nodes of FIG. 2, are equal to their degrees 6, 5, 5 and 5.

In order to express degree distribution for the nodes of the LDPC code, a ratio of the number of degree-i variable nodes to the total number of variable nodes is defined as $f_i$, and a ratio of the number of degree-j check nodes to the total number of check nodes is defined as $g_j$. For instance, for the LDPC code corresponding to FIGS. 1 and 2, $f_2=4/8$, $f_3=3/8$, $f_4=1/8$, and $f_i=0$ for $i \neq 2, 3, 4$; and $g_5=3/4$, $g_6=1/4$, and $g_j=0$ for $j \neq 5, 6$. When a length of the LDPC code, i.e., the number of columns, is defined as N, and the number of rows is defined as N/2, the density of non-zero entries in the entire parity-check matrix having the above degree distribution is computed as Equation (1).

$$\frac{2f_2 N + 3f_3 N + 4f_4 N}{N \cdot N/2} = \frac{5.25}{N} \qquad (1)$$

In Equation (1), as N increases, the density of '1's in the parity-check matrix decreases. Generally, as for the LDPC code, since the code length N is inversely proportional to the density of non-zero entries, the LDPC code with a large N has a very low density of non-zero entries. The wording 'low-density' in the name of the LDPC code originates from the above-mentioned relationship.

Next, with reference to FIG. 3, a description will be made of characteristics of a parity-check matrix of a structured LDPC code to be applied in the present invention. FIG. 3 schematically illustrates an LDPC code adopted as the standard technology in Digital Video Broadcasting-Satellite transmission $2^{nd}$ generation (DVB-S2), which is one of the European digital broadcasting standards.

In FIG. 3, $N_1$ denotes a length of an LDPC codeword, $K_1$ provides a length of an information word, and $(N_1-K_1)$ provides a parity length. Further, integers $M_1$ and q are determined to satisfy $q=(N_1-K_1)/M_1$. Preferably, $K_1/M_1$ should also be an integer.

Referring to FIG. 3, a structure of a parity part, i.e., $K_1^{th}$ column through $(N_1-1)^{th}$ column, in the parity-check matrix, has a dual diagonal shape. Therefore, as for degree distribution over columns corresponding to the parity part, all columns have a degree '2', except for the last column having a degree '1'.

In the parity-check matrix, a structure of an information part, i.e., $0^{th}$ column through $(K_1-1)^{th}$ column, is made using the following rules.

Rule 1: A total of $K_1/M_1$ column groups are generated by grouping $K_1$ columns corresponding to the information word in the parity-check matrix into multiple groups each composed of $M_1$ columns. A method for forming columns belonging to each column group follows Rule 2 below.

Rule 2: Positions of '1's in each $0^{th}$ column in $i^{th}$ column groups (where $i=1, \ldots, K_1/M_1$) are first determined. When a degree of a $0^{th}$ column in each $i^{th}$ column group is denoted by $D_i$, if positions of rows with 1 are assumed to be $R_{i,0}^{(1)}$, $R_{i,0}^{(2)}, \ldots, R_{i,0}^{(D_i)}$, positions $R_{i,j}^{(k)}$ ($k=1, 2, \ldots, D_i$) of rows with 1 are defined as Equation (2), in a $j^{th}$ column (where $j=1, 2, \ldots, M_1-1$) in an $i^{th}$ column group.

$$R_{i,j}^{(k)}=R_{i,(j-1)}^{(k)}+q \bmod(N_1-K_1), \quad (2)$$

$k=1, 2, \ldots, D_i, i=1, \ldots, K_1/M_1, j=1, \ldots, M_1-1$

According to the above rules, it is can be appreciated that degrees of columns belonging to an $i^{th}$ column group (where $i=1, \ldots, K_1/M_1$) are all equal to $D_i$. For a better understanding of a structure of a DVB-S2 LDPC code that stores information on the parity-check matrix according to the above rules, the following detailed example will be described.

As a detailed example, for $N_1=30$, $K_1=15$, $M_1=5$ and $q=3$, three sequences for the information on the positions of rows with 1 for $0^{th}$ columns in 3 column groups can be expressed as follows. Herein, these sequences are called "weight-1 position sequences" for convenience.

$R_{1,0}^{(1)}=0, R_{1,0}^{(2)}=1, R_{1,0}^{(3)}=2,$ $R_{2,0}^{(1)}=0, R_{2,0}^{(2)}=11, R_{2,0}^{(3)}=13,$ $R_{3,0}^{(1)}=0, R_{3,0}^{(2)}=10, R_{3,0}^{(3)}=14.$

Regarding the weight-1 position sequence for $0^{th}$ columns in each column group, only the corresponding position sequences can be expressed as follows for each column group. For example:

0 1 2
0 11 13
0 10 14.

In other words, the $i^{th}$ weight-1 position sequence in the $i^{th}$ line sequentially represents the information on the positions of rows with 1 in the $i^{th}$ column group.

It is possible to generate an LDPC code having the same concept as that of a DVB-S2 LDPC code of FIG. 4, by forming a parity-check matrix using the information corresponding to the detailed example, and Rule 1 and Rule 2.

It is known that the DVB-S2 LDPC code designed in accordance with Rule 1 and Rule 2 can be efficiently encoded using the structural shape. Respective steps in a process of performing LDPC encoding using the DVB-S2 based parity-check matrix will be described below by way of example.

In the following description, as a detailed example, a DVB-S2 LDPC code with $N_1=16200$, $K_1=10800$, $M_1=360$ and $q=15$ undergoes an encoding process. For convenience, information bits having a length $K_1$ are represented as $(i_0, i_1, \ldots, i_{K_1-1})$, and parity bits having a length $(N_1-K_1)$ are expressed as $(p_0, p_1, \ldots, p_{N_1-K_1-1})$.

Step 1: An LDPC encoder initializes parity bits as follows:

$p_0=p_1=\ldots=p_{N_1K_1-1}=0$

Step 2: The LDPC encoder reads information on a row where 1 is located in a column group from a $0^{th}$ weight-1 position sequence out of the stored sequences indicating the parity-check matrix.

0 2084 1613 1548 1286 1460 3196 4297 2481 3369
3451 4620 2622

$R_{1,0}^{(1)}=0, R_{1,0}^{(2)}=2048, R_{1,0}^{(3)}=1613, R_{1,0}^{(4)}=1548,$
$R_{1,0}^{(5)}=1286,$ $R_{1,0}^{(6)}=1460, R_{1,0}^{(7)}=3196, R_{1,0}^{(8)}=4297, R_{1,0}^{(9)}=$
$2481, R_{1,0}^{(10)}=3369,$ $R_{1,0}^{(11)}=3451, R_{1,0}^{(12)}=4620, R_{1,0}^{(13)}=2622.$

The LDPC encoder updates particular parity bits $p_x$ in accordance with Equation (3) using the read information and the first information bit $i_0$. Herein, x denotes a value of $R_{1,0}^{(k)}$ for $k=1, 2, \ldots, 13$.

$p_0=p_0 \oplus i_0, p_{2084}=p_{2064} \oplus i_0, p_{1613}=p_{1613} \oplus i_0,$ $p_{1548}=p_{1548} \oplus i_0, p_{1286}=p_{1286} \oplus i_0, p_{1460}=p_{1460} \oplus i_0,$ $p_{3196}=p_{3196} \oplus i_0, p_{4297}=p_{4297} \oplus i_0, p_{2481}=p_{2481} \oplus i_0,$ $p_{3369}=p_{3369} \oplus i_0, p_{3451}=p_{3451} \oplus i_0, p_{4620}=p_{4620} \oplus i_0,$ $p_{2622}=p_{2622} \oplus i_0 \quad (3)$ In Equation (3), $p_x=p_x \oplus i_0$ can also be expressed as $p_x \leftarrow p_x \oplus i_0$, and $\oplus$ denotes binary addition.

Step 3: The LDPC encoder first finds out a value of Equation (4) for the next 359 information bits $i_m$ (where $m=1, 2, \ldots, 359$) after $i_0$.

$\{x+(m \bmod M_1) \times q\} \bmod(N_1-K_1), M_1=360, m=1,$
$2, \ldots, 359 \quad (4)$ In Equation (4), x denotes a value of $R_{1,0}^{(k)}$ for $k=1, 2, \ldots, 13$. It should be noted that Equation (4) has the same concept as Equation (2).

Next, the LDPC encoder performs an operation similar to Equation (3) using the value found in Equation (4). That is, the LDPC encoder updates $p_{\{x+(m \bmod M_1) \times q\} \bmod(N_1-K_1)}$ for $i_m$. For example, for $m=1$, i.e., for $i_1$, the LDPC encoder updates parity bits $p(x+q)\bmod(N_1-K_1)$ as defined in Equation (5).

$p_{15}=p_{15} \oplus i_1, p_{2099}=p_{2099} \oplus i_1, p_{1628}=p_{1628} \oplus i_1,$ $p_{1563}=p_{1563} \oplus i_1, p_{1301}=p_{1301} \oplus i_1, p_{1475}=p_{1475} \oplus i_1,$ $p_{3211}=p_{3211} \oplus i_1, p_{4312}=p_{4312} \oplus i_1, p_{2496}=p_{2496} \oplus i_1,$ $p_{3384}=p_{3384} \oplus i_1, p_{3466}=p_{3466} \oplus i_1, p_{4635}=p_{4635} \oplus i_1,$ $p_{2637}=p_{2637} \oplus i_0 \quad (5)$ It should be noted that q=15 in Equation (5). The LDPC encoder performs the above process for m=1, 2, . . . , 359, in the same manner as shown above.

Step 4: As in Step 2, the LDPC encoder reads information of the $1^{st}$ weight-1 position sequence (k=1, 2, . . . , 13) for a $361^{st}$ information bit $i_{360}$, and updates a particular $p_x$, where x denotes $R_{2,0}^{(k)}$. The LDPC encoder updates $p_{\{x+(m\,mod\,M_1)\times q\}\,mod(N_1-K_1)}$, m=361, 362, . . . , 719 by similarly applying Equation (4) to the next 359 information bits $i_{361}$, $i_{362}$, . . . , $i_{719}$ after $i_{360}$.

Step 5: The LDPC encoder repeats Steps 2, 3 and 4 for all groups each having 360 information bits.

Step 6: The LDPC encoder finally determines parity bits using Equation (6).

$$p_i = p_i \oplus p_{i-1}, i=1, 2, \ldots, N_1-K_1-1 \quad (6)$$

The parity bits $p_i$ of Equation (6) are parity bits that undervent LDPC encoding.

As described above, in DVB-S2, the LDPC encoder performs LDPC encoding through the process of Step 1 through Step 6.

It is well known that performance of the LDPC code is closely related to cycle characteristics of the Tanner graph. In particular, it is well known by experiments that performance degradation may occur when the number of short-length cycles is great in the Tanner graph. Thus, the cycle characteristics on the Tanner graph should be considered in order to design LDPC codes having high performance.

However, no method has been proposed that designs DVB-S2 LDPC codes having good cycle characteristics. For the DVB-S2 LDPC code, an error floor phenomenon is observed at a high Signal to Noise Ratio (SNR) as optimization on cycle characteristics of the Tanner graph is not considered. For these reasons, there is a need for a method capable of efficiently improving cycle characteristics in designing LDPC codes having the DVB-S2 structure.

SUMMARY OF THE INVENTION

The present invention has been made to address at least the above problems and/or disadvantages and to provide at least the advantages described below. Accordingly, an aspect of the present invention provides a channel encoding/decoding apparatus and method for designing a parity-check matrix of a quasi-cyclic LDPC code designed based on a circulant permutation matrix to design a DVB-S2 LDPC code in a communication system using LDPC codes.

Another aspect of the present invention provides a channel encoding/decoding apparatus and method for designing a parity-check matrix of the same LDPC code as the DVB-S2 LDPC code having a good Tanner graph characteristic in a communication system using LDPC codes.

According to one aspect of the present invention, a method is provided for generating a parity-check matrix of a Low-Density Parity-Check (LDPC) code. Parameters for designing the LDPC code are determined. A first parity-check matrix of a quasi-cyclic LDPC code is formed according to the determined parameters. A second parity-check matrix is created through the elimination of a predetermined portion of a parity part in the first parity-check matrix. A third parity-check matrix is created by rearranging the second parity-check matrix.

According to another aspect of the present invention, a method is provided for encoding a channel in a communication system using a Low-Density Parity-Check (LDPC) code. A stored parity-check matrix is read. A received signal is LDPC-encoded using the stored parity-check matrix. The parity-check matrix is divided into an information word and a parity. When a code rate is ⅗ and a length of a codeword is 16200, the parity-check matrix is formed as defined in the following table;

| |
|---|
| 71 1478 1901 2240 2649 2725 3592 3708 3965 4080 5733 6198 |
| 393 1384 1435 1878 2773 3182 3586 5465 6091 6110 6114 6327 |
| 160 1149 1281 1526 1566 2129 2929 3095 3223 4250 4276 4612 |
| 289 1446 1602 2421 3559 3796 5590 5750 5763 6168 6271 6340 |
| 947 1227 2008 2020 2266 3365 3588 3867 4172 4250 4865 6290 |
| 3324 3704 4447 |
| 1206 2565 3089 |
| 529 4027 5891 |
| 141 1187 3206 |
| 1990 2972 5120 |
| 752 796 5976 |
| 1129 2377 4030 |
| 6077 6108 6231 |
| 61 1053 1781 |
| 2820 4109 5307 |
| 2088 5834 5988 |
| 3725 3945 4010 |
| 1081 2780 3389 |
| 659 2221 4822 |
| 3033 6060 6160 |
| 756 1489 2350 |
| 3350 3624 5470 |
| 357 1825 5242 |
| 585 3372 6062 |
| 561 1417 2348 |
| 971 3719 5567 |
| 1005 1675 2062 |

According to a further embodiment of the present invention, a method is provided for decoding a channel in a communication system using a Low-Density Parity-Check (LDPC) code. A parity-check matrix of the LDPC code is extracted. LDPC decoding is performed using the extracted parity-check matrix. The extracted parity-check matrix is divided into a parity and an information word. When a code rate is ⅗ and a length of a codeword is 16200, the parity-check matrix is formed as defined in the following table;

| |
|---|
| 71 1478 1901 2240 2649 2725 3592 3708 3965 4080 5733 6198 |
| 393 1384 1435 1878 2773 3182 3586 5465 6091 6110 6114 6327 |
| 160 1149 1281 1526 1566 2129 2929 3095 3223 4250 4276 4612 |
| 289 1446 1602 2421 3559 3796 5590 5750 5763 6168 6271 6340 |
| 947 1227 2008 2020 2266 3365 3588 3867 4172 4250 4865 6290 |
| 3324 3704 4447 |
| 1206 2565 3089 |
| 529 4027 5891 |
| 141 1187 3206 |
| 1990 2972 5120 |
| 752 796 5976 |
| 1129 2377 4030 |
| 6077 6108 6231 |
| 61 1053 1781 |
| 2820 4109 5307 |
| 2088 5834 5988 |
| 3725 3945 4010 |
| 1081 2780 3389 |
| 659 2221 4822 |
| 3033 6060 6160 |
| 756 1489 2350 |
| 3350 3624 5470 |
| 357 1825 5242 |
| 585 3372 6062 |
| 561 1417 2348 |
| 971 3719 5567 |
| 1005 1675 2062 |

According to an additional aspect of the present invention, an apparatus is provided for encoding a channel in a communication system using a Low-Density Parity-Check (LDPC) code. An LDPC code parity-check matrix extractor reads a stored parity-check matrix. An LDPC encoder LDPC-encodes a received signal using the stored parity-check matrix. The parity-check matrix is divided into a parity and an information word. When a code rate is ⅗ and a length of a codeword is 16200, the parity-check matrix is formed as defined in the following table;

| |
|---|
| 71 1478 1901 2240 2649 2725 3592 3708 3965 4080 5733 6198 |
| 393 1384 1435 1878 2773 3182 3586 5465 6091 6110 6114 6327 |
| 160 1149 1281 1526 1566 2129 2929 3095 3223 4250 4276 4612 |
| 289 1446 1602 2421 3559 3796 5590 5750 5763 6168 6271 6340 |
| 947 1227 2008 2020 2266 3365 3588 3867 4172 4250 4865 6290 |
| 3324 3704 4447 |
| 1206 2565 3089 |
| 529 4027 5891 |
| 141 1187 3206 |
| 1990 2972 5120 |
| 752 796 5976 |
| 1129 2377 4030 |
| 6077 6108 6231 |
| 61 1053 1781 |
| 2820 4109 5307 |
| 2088 5834 5988 |
| 3725 3945 4010 |
| 1081 2780 3389 |
| 659 2221 4822 |
| 3033 6060 6160 |
| 756 1489 2350 |
| 3350 3624 5470 |
| 357 1825 5242 |
| 585 3372 6062 |
| 561 1417 2348 |
| 971 3719 5567 |
| 1005 1675 2062 |

According to another further aspect of the present invention, an apparatus is provided for decoding a channel in a communication system using a Low-Density Parity-Check (LDPC) code. An LDPC code parity-check matrix extractor reads a stored parity-check matrix. An LDPC decoder performs LDPC decoding using the read parity-check matrix. The read parity-check matrix is divided into a parity and an information word. When a code rate is ⅗ and a length of a codeword is 16200, the read parity-check matrix is formed as defined in the following table;

| |
|---|
| 71 1478 1901 2240 2649 2725 3592 3708 3965 4080 5733 6198 |
| 393 1384 1435 1878 2773 3182 3586 5465 6091 6110 6114 6327 |
| 160 1149 1281 1526 1566 2129 2929 3095 3223 4250 4276 4612 |
| 289 1446 1602 2421 3559 3796 5590 5750 5763 6168 6271 6340 |
| 947 1227 2008 2020 2266 3365 3588 3867 4172 4250 4865 6290 |
| 3324 3704 4447 |
| 1206 2565 3089 |
| 529 4027 5891 |
| 141 1187 3206 |
| 1990 2972 5120 |
| 752 796 5976 |
| 1129 2377 4030 |
| 6077 6108 6231 |
| 61 1053 1781 |
| 2820 4109 5307 |
| 2088 5834 5988 |
| 3725 3945 4010 |
| 1081 2780 3389 |
| 659 2221 4822 |
| 3033 6060 6160 |
| 756 1489 2350 |
| 3350 3624 5470 |
| 357 1825 5242 |
| 585 3372 6062 |
| 561 1417 2348 |
| 971 3719 5567 |
| 1005 1675 2062 |

BRIEF DESCRIPTION OF THE DRAWINGS

The above and other aspects, features and advantages of the present invention will become more apparent from the following detailed description when taken in conjunction with the accompanying drawings in which:

FIG. 7 is a diagram illustrating the result obtained by transforming the parity-check matrix of the quasi-cyclic LDPC code necessary for design of a DVB-S2 LDPC code, according to an embodiment of the present invention;

DETAILED DESCRIPTION OF PREFERRED EMBODIMENTS

Figures 1, 2:
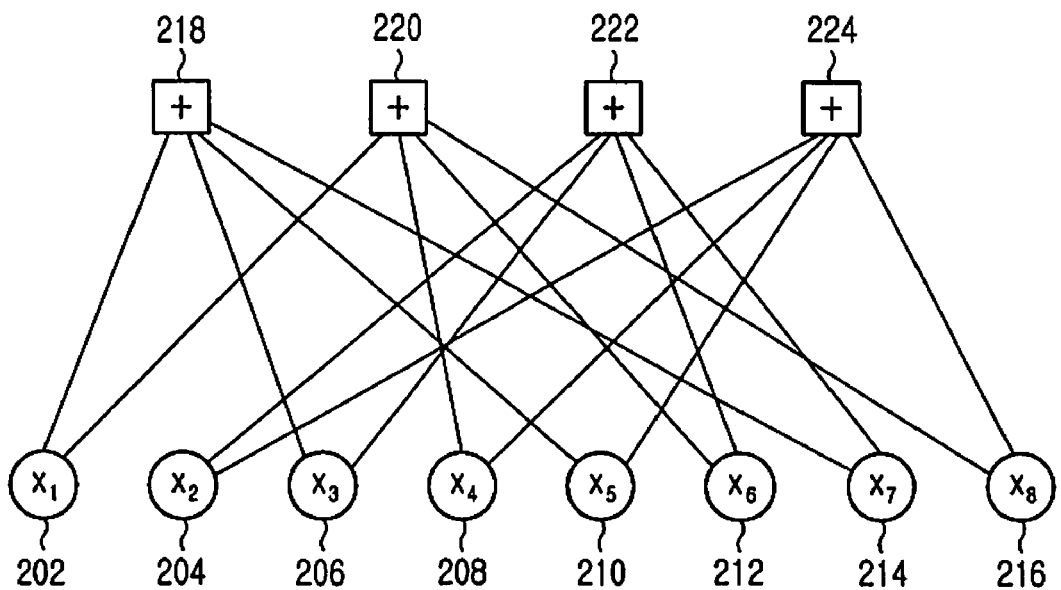
FIG. 1 is a diagram illustrating a parity-check matrix of a length-8 LDPC code.
FIG. 2 is a diagram illustrating a Tanner graph of a parity-check matrix of a length-8 LDPC code.

Preferred embodiments of the present invention are described in detail with reference to the annexed drawings. The same or similar components are designated by the same or similar reference numerals although they are illustrated in different drawings. Detailed descriptions of constructions or processes known in the art may be omitted to avoid obscuring the subject matter of the present invention.

The present invention provides a method for designing a DVB-S2 LDPC code having a good Tanner graph characteristic. In addition, the present invention provides a method for generating an LDPC codeword using a parity-check matrix of the above-designed LDPC code and an apparatus thereof.

Structural characteristics of a DVB-S2 LDPC code are described below using a parity-check matrix of a DVB-S2 LDPC code shown in FIG. 4. For the parity-check matrix shown in FIG. 4, $N_1=30$, $K_1=15$, $M_1=5$ and $q=3$, and weight-1 position sequences of rows for $0^{th}$ columns in three column groups are as follows:

0 1 2
0 11 13
0 10 14

Here, an $i^{th}$ weight-1 position sequence in the $i^{th}$ line sequentially represents the information on the positions of rows with 1 in the $i^{th}$ column group.

Figure 4:
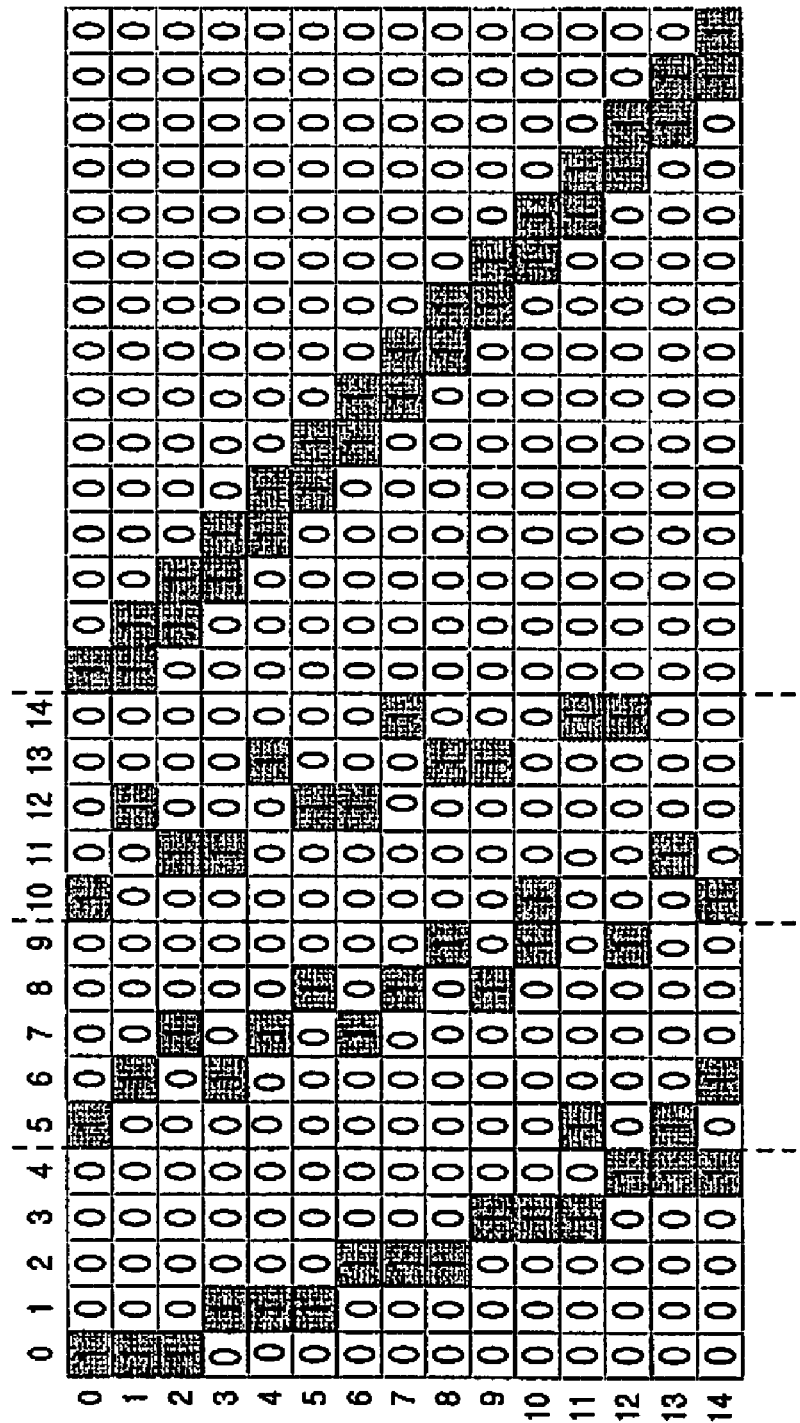
FIG. 4 is a diagram illustrating a parity-check matrix of a DVB-S2 LDPC code.

The parity-check matrix of FIG. 4 is reconstructed in accordance with the following rules. FIG. 4 is a diagram illustrating a parity-check matrix of a DVB-S2 LDPC code.

Rule 3: $0^{th}$ row through $(N_1-K_1-1)^{th}$ row are rearranged so that a $(q \cdot i+j)^{th}$ row is located in an $(M_1 \cdot j+i)^{th}$ row, where $0 \leq i \leq M_1$ and $0 \leq j < q$.

Rule 4: With $0^{th}$ column through $(K_1-1)^{th}$ column being kept intact, $K_1^{th}$ column through $(N_1-1)^{th}$ column are rearranged so that a $(K_1+q \cdot i+j)^{th}$ column is located in a $(K_1+M_1 \cdot j+i)^{th}$ column.

Figure 5:
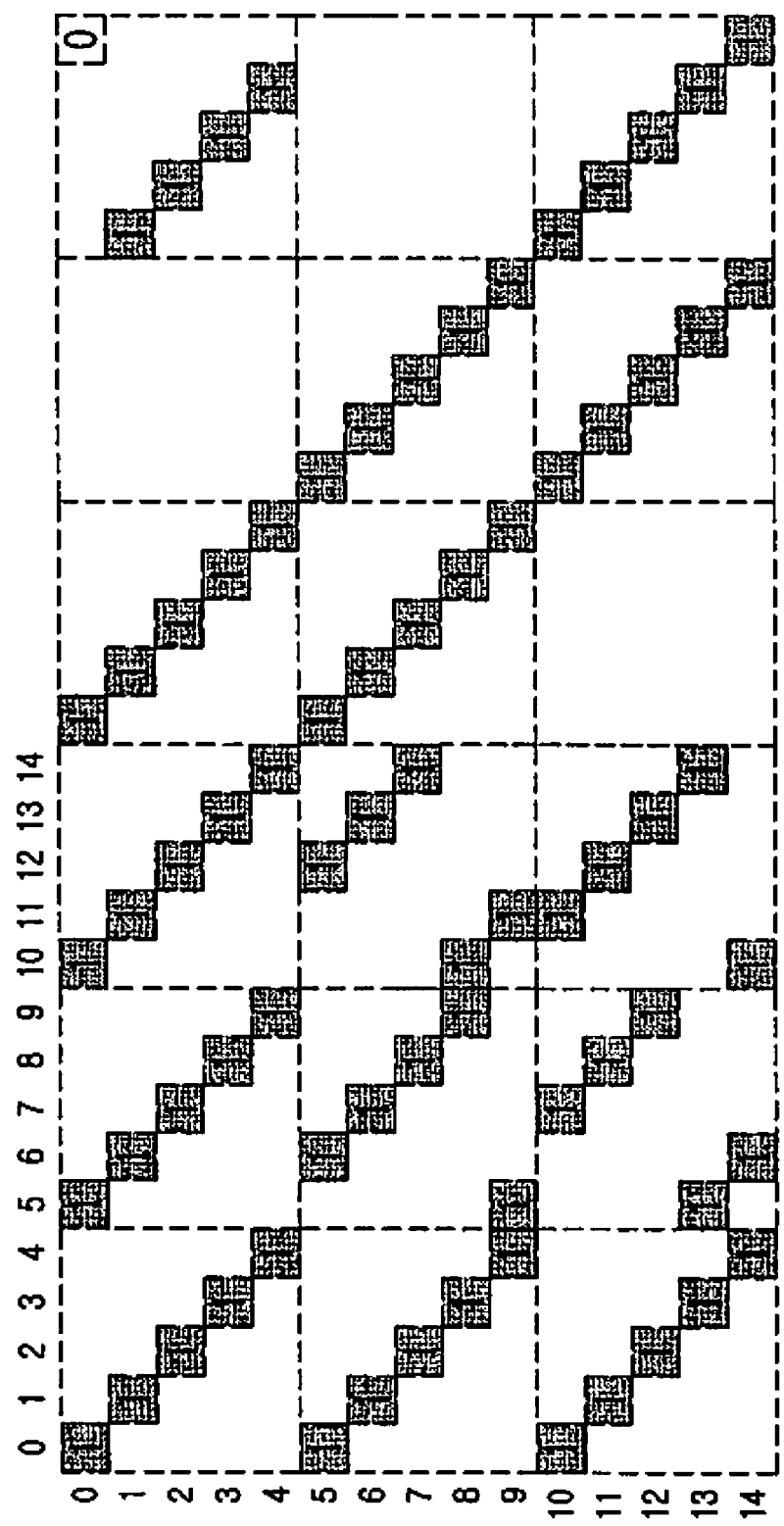
FIG. 5 is a diagram illustrating a parity-check matrix generated by rearranging columns and rows in the parity-check matrix of the DVB-S2 LDPC code of FIG. 4 according to predetermined rules, according to an embodiment of the present invention.

A parity-check matrix with a shape shown in FIG. 5 is obtained by reconstructing the parity-check matrix of FIG. 4 in accordance with Rule 3 and Rule 4. FIG. 5 illustrates a parity-check matrix generated by rearranging columns and rows in the parity-check matrix of the DVB-S2 LDPC code of FIG. 4 according to predetermined rules, according to an embodiment of the present invention.

If it is assumed in FIG. 5 that '1' exists in an $(N_1-1)^{th}$ column at a $0^{th}$ row, it can be appreciated that the parity-check matrix in FIG. 5 corresponds to a kind of a quasi-cyclic LDPC code consisting of a circulant permutation matrix with a size of $M_1 \times M_1$, i.e. 5×5. The 'circulant permutation matrix' is defined as a kind of a permutation matrix created by circular-shifting rows in identity matrixes rightward one by one. In addition, the 'quasi-cyclic LDPC code' is defined as a sort of an LDPC code created by dividing a parity-check matrix into several blocks with the same size and mapping circulant permutation matrixes or zero matrixes to the blocks.

In summary, it can be understood that a parity-check matrix similar to the quasi-cyclic LDPC code can be obtained by reconstructing a parity-check matrix of the DVB-S2 LDPC code through Rule 3 and Rule 4. Also, it is expected that the DVB-S2 LDPC code can be generated from the quasi-cyclic LDPC code through the reverse process of Rule 3 and Rule 4.

While there is no known research result on the DVB-S2 LDPC code, there are many known design methods for the quasi-cyclic LDPC code. The design methods for the quasi-cyclic LDPC code include well-known methods for optimizing cycle characteristics on the Tanner graph.

An embodiment of the present invention proposes a method for designing a DVB-S2 LDPC code using the well-known method for improving cycle characteristics on the Tanner graph of the quasi-cyclic LDPC code. However, since the method for improving cycle characteristics of the quasi-cyclic LDPC code is only indirectly related to the present invention, a detailed description thereof will be omitted for simplicity.

A description of a method for designing a DVB-S2 LDPC code using a quasi-cyclic LDPC code is provided below. The DVB-S2 LDPC code has a codeword length NJ, an information length $K_1$, and a parity length $(N_1-K_1)$, and $q=(N_1-K_1)/M_1$.

Figure 6:
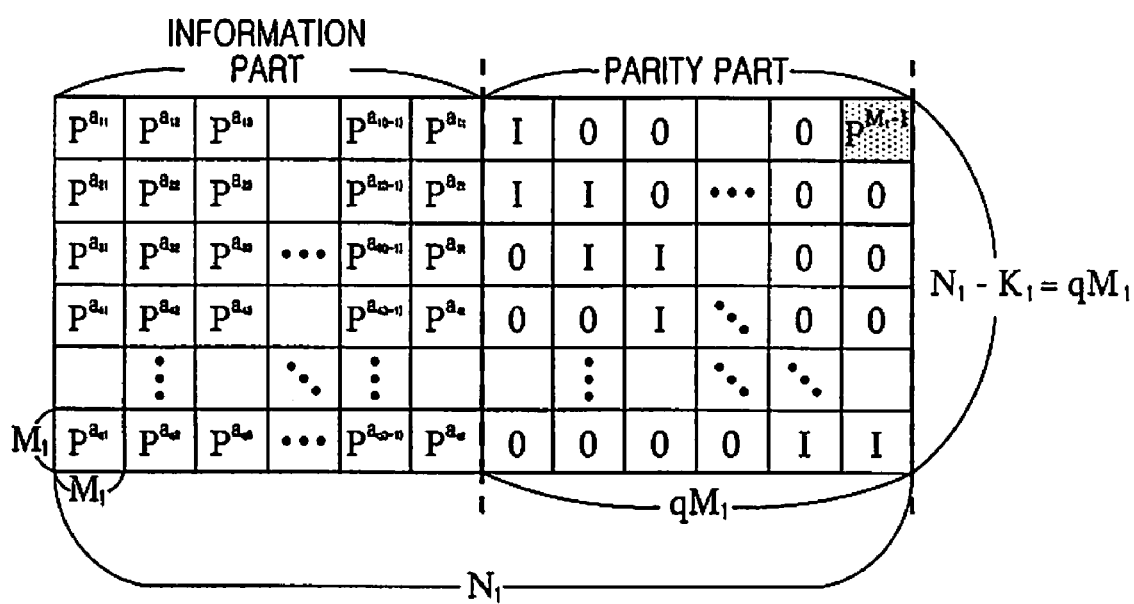
FIG. 6 is a diagram illustrating a parity-check matrix of a quasi-cyclic LDPC code necessary for designing a DVB-S2 LDPC code, according to an embodiment of the present invention.

A parity-check matrix of a quasi-cyclic LDPC code is shown in FIG. 6. FIG. 6 is a diagram illustrating a parity-check matrix of a quasi-cyclic LDPC code necessary for designing a DVB-S2 LDPC code, according to an embodiment of the present invention. The parity-check matrix shown in FIG. 6 has $(N_1-K_1)$ rows and $N_1$ columns, and is divided into $M_1 \times M_1$ partial blocks. For convenience, if $t=K_1/M_1$, an information part and a parity part in the parity-check matrix of FIG. 6 consist of t column blocks and q column blocks, respectively, and have a total of q row blocks. Here, $N_1/M_1=t+q$.

The respective partial blocks constituting the parity-check matrix of FIG. 6 correspond to circulant permutation matrixes or zero matrixes. Here, the circulant permutation matrix has a size of $M_1 \times M_1$, and is created based on a circulant permutation matrix P, which is defined as:

$$P = \begin{bmatrix} 0 & 1 & 0 & \ldots & 0 \\ 0 & 0 & 1 & \ldots & 0 \\ 0 & 0 & 0 & \ldots & 0 \\ \vdots & \vdots & \vdots & \ddots & 1 \\ 1 & 0 & 0 & \ldots & 0 \end{bmatrix}$$

In FIG. 6, $a_{ij}$ has an integer of 0 through $M_1-1$ or a value of $\infty$, $P^0$ is defined as an identity matrix I, and $P^\infty$ denotes an $M_1 \times M_1$ zero matrix. Also, numerals '0' in the parity part denote $M_1 \times M_1$ zero matrixes.

The parity-check matrix of FIG. 6 is characterized in that column blocks corresponding to the parity have identity matrixes I and a circulant permutation matrix $P^{M_1-1}$ as shown in the drawing. In other words, the column blocks corresponding to the parity are fixed to the structure shown in FIG. 6. The circulant permutation matrix $P^{M_1-1}$ is defined as:

$$P^{M_1-1} = \begin{bmatrix} 0 & 0 & \ldots & 0 & 1 \\ 1 & 0 & \ldots & 0 & 0 \\ 0 & 1 & \ldots & 0 & 0 \\ \vdots & \vdots & \ddots & \vdots & 0 \\ 0 & 0 & \ldots & 1 & 0 \end{bmatrix}$$

The quasi-cyclic LDPC code shown in FIG. 6 is the part that remains unchanged in the process of optimizing cycles of the quasi-cyclic LDPC code as the structures of column blocks corresponding to its parity part are fixed. In other words, since the column blocks corresponding to the parity part are fixed in the parity-check matrix of FIG. 6, the connections between variable nodes corresponding to the parity are determined on the Tanner graph, so it only needs to optimize the connections between variable nodes corresponding to the information part in order to optimize cycles of the Tanner graph.

As described above, there are many known methods for optimizing cycle characteristics on the Tanner graph of the quasi-cyclic LDPC code. Since the design method for the quasi-cyclic LDPC code with a Tanner graph having the optimized cycle characteristics is only indirectly related to the present invention, a detailed description thereof is omitted herein.

It is assumed that degree distribution is determined to show excellent performance in the state where the structure of the parity part is fixed in the quasi-cyclic parity-check matrix of FIG. 6 through the design method for the quasi-cyclic LDPC code. Positions of the circulant permutation matrix and the zero matrixes are determined in the column blocks corresponding to the information part according to the degree distribution. Cycle characteristics of the Tanner graph are optimized.

The form shown in FIG. 7, for example, can be made by eliminating '1' in the last column at the first row in the circulant permutation matrix $P^{M_1-1}$ corresponding to the last $(N_1/M_1)^{th}$ or $(t+q)^{th}$ column block at the first row block in the parity-check matrix of FIG. 6. FIG. 7 is a diagram illustrating the result obtained by transforming the parity-check matrix of the quasi-cyclic LDPC code necessary for design of a DVB-S2 LDPC code, according to an embodiment of the present invention.

It should be noted that the circulant permutation matrix $P^{M_1-1}$ is changed to the following matrix Q in FIG. 7.

$$Q = \begin{bmatrix} 0 & 0 & \cdots & 0 & 0 \\ 1 & 0 & \cdots & 0 & 0 \\ 0 & 1 & \cdots & 0 & 0 \\ \vdots & \vdots & \ddots & \vdots & 0 \\ 0 & 0 & \cdots & 1 & 0 \end{bmatrix}$$

The following Rule 5 and Rule 6 are defined to apply the reverse process of Rule 3 and Rule 4.

Rule 5: With $0^{th}$ column through $(K_1-1)^{th}$ column being kept intact, $K_1^{th}$ column through $(N_1-1)^{th}$ column are rearranged so that a $(K_1+M_1 \cdot j+i)^{th}$ column is located in a $(K_1+q \cdot i+j)^{th}$ column, where $0 \leq i < M_1$ and $0 \leq j < q$.

Rule 6: $0^{th}$ row through $(N_1-K_1-1)^{th}$ row are rearranged so that an $(M_1 \cdot j+i)^{th}$ row is located in a $(q \cdot i+j)^{th}$ row.

Figure 3:
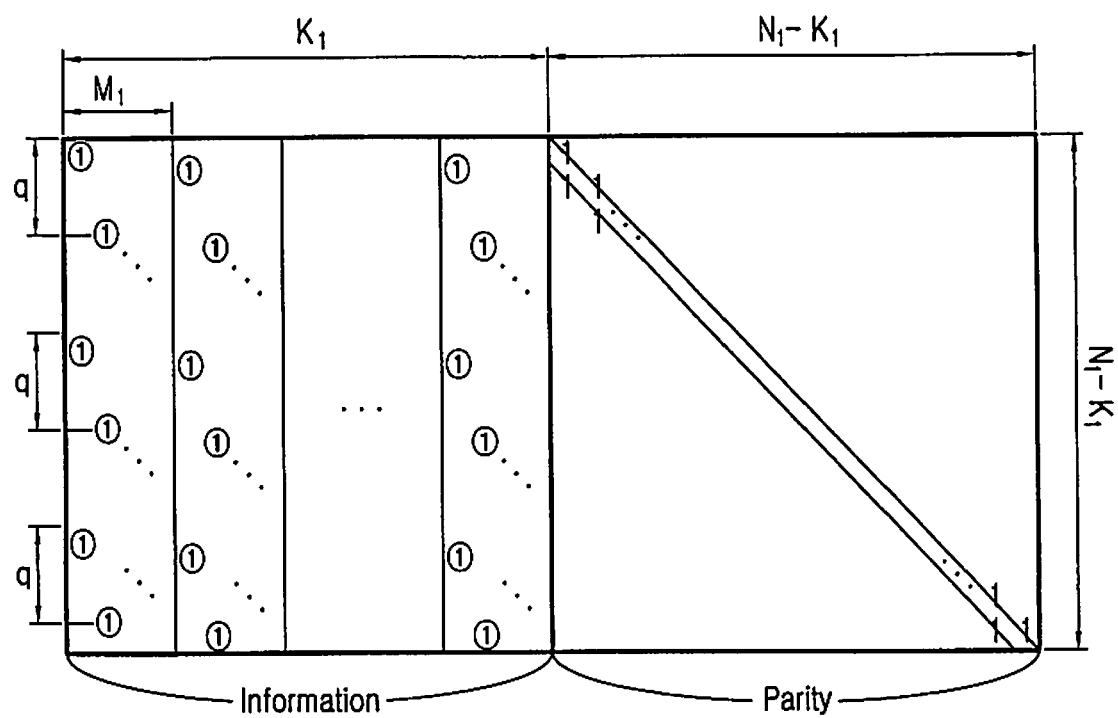
FIG. 3 is a diagram illustrating a schematic structure of a DVB-S2 LDPC code.

The parity-check matrix of the LDPC code generated from the quasi-cyclic LDPC code of FIG. 6 through the above-described process by applying Rule 5 and Rule 6 becomes the parity-check matrix having the form of the DVB-S2 LDPC code shown in FIG. 3, for example. The above-described method for designing a DVB-S2 parity-check matrix, in which its codeword, information and parity lengths are $N_1$, $K_1$ and $(N_1-K_1)$, respectively, and $q=(N_1-K_1)/M_1$, can be summarized into the following process.

DVB-S2 LDPC Code Design Process

Figure 8:
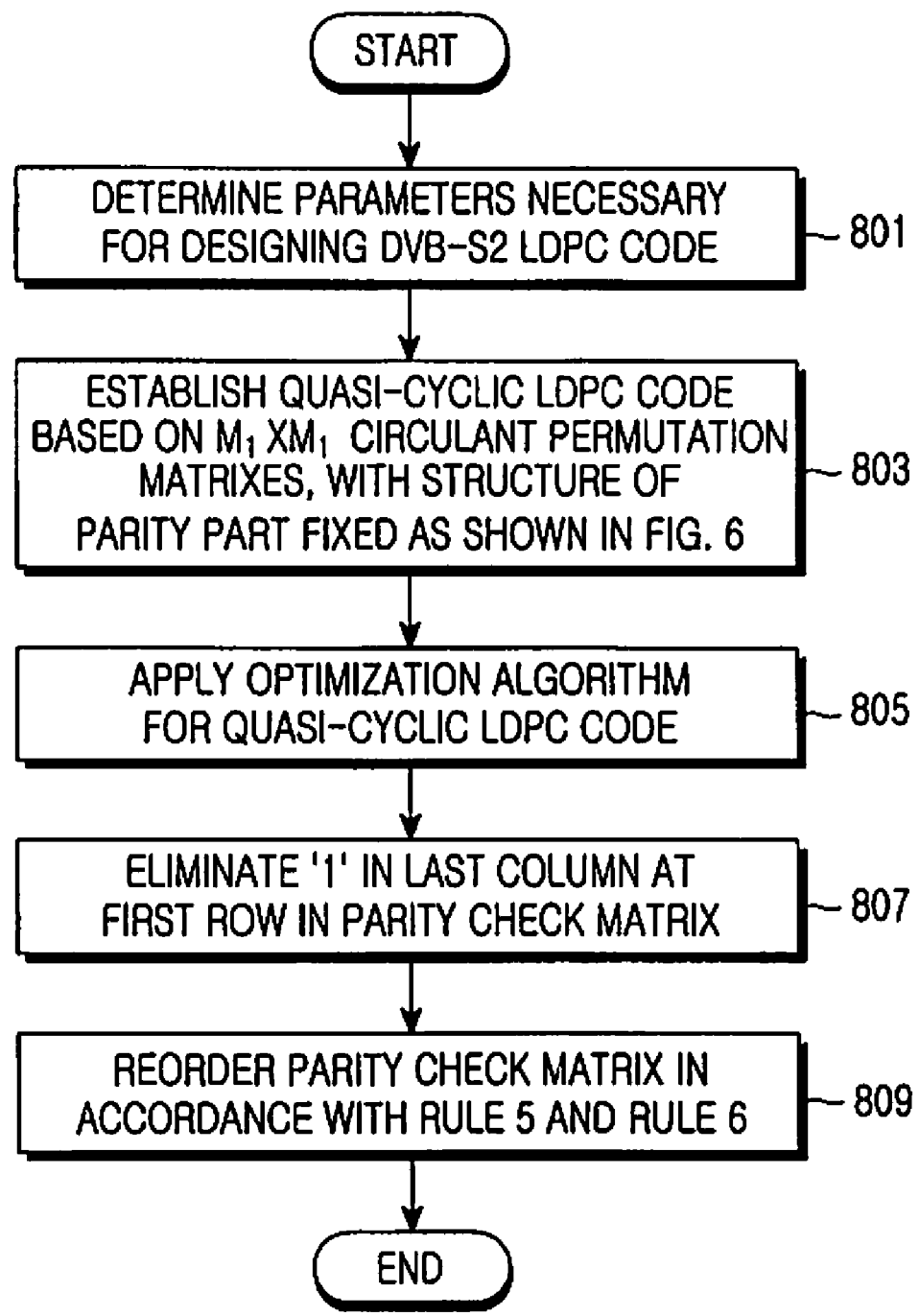
FIG. 8 is a flowchart illustrating a process of designing a DVB-S2 LDPC code, according to an embodiment of the present invention.

FIG. 8 is a flowchart illustrating a process of designing a DVB-S2 LDPC code according to an embodiment of the present invention.

Referring to FIG. 8, parameters necessary for designing a desired DVB-S2 LDPC code are determined in step 801. It is assumed herein that the parameters such as a codeword length and an information length as well as the good degree distribution are previously determined to design the DVB-S2 LDPC code.

Next, in step 803, a parity-check matrix of a quasi-cyclic LDPC code consisting of $M_1 \times M_1$ circulant permutation matrixes and zero matrixes as shown in FIG. 6 is formed according to the parameters determined in step 801. In FIG. 6, column blocks corresponding to a parity part are always fixed to a particular form.

In step 805, circulant permutation matrixes of column blocks corresponding to an information part in FIG. 6 are determined by applying an algorithm for improving cycle characteristics of a Tanner graph of the quasi-cyclic LDPC code. Any known algorithm for improving cycle characteristics can be used herein.

In step 807, a parity-check matrix shown in FIG. 7, for example, is obtained by eliminating '1' in the last column at the first row in the parity-check matrix of FIG. 6, which has been settled in step 805.

In step 809, columns and rows in the parity-check matrix of FIG. 7 are rearranged by applying Rule 5 and Rule 6 to the parity-check matrix of FIG. 7. The finally obtained parity-check matrix can be the DVB-S2 LDPC code shown in FIG. 3, for example.

A codeword can be generated by applying the above-described DVB-S2 LDPC encoding process to the LDPC code designed through the above steps.

To analyze performance of the DVB-S2 LDPC code, a DVB-S2 LDPC code having the following parameters was designed. For example, $N_1=648000, K_1=38880, M_1=360, q=72$ To design rate-$\frac{3}{5}$ DVB-S2 LDPC codes having the above parameters, parity-check matrixes shown in Table 1 and Table 2, for example, can be obtained from a quasi-cyclic LDPC code having a total of $N/M_1=180$ column blocks and $q=(N_1-K_1)/M_1=72$ row blocks by applying the DVB-S2 LDPC code design process. An $i^{th}$ weight-1 position sequence in an $i^{th}$ column sequentially represents the information on the positions of rows with 1 in an $i^{th}$ column group.

TABLE 1

1443 3685 4728 5466 7771 9999 16155 17401 21311 21467 23168 24511
664 3974 5090 7327 8542 10468 11150 13508 17161 17754 19402 19447
2405 3298 3552 6482 11801 12626 14735 14828 16324 20133 21078 22381
658 3063 9064 10137 11859 12209 12669 14316 15564 17804 19510 21077
4235 6052 7528 9935 11629 12825 12966 17595 21024 21298 22559 24356
87 6396 8610 12968 13554 13692 15316 18113 18989 21291 23791 24092
8 217 1180 5344 5766 5971 8402 9481 9547 11091 12801 20487
7857 9024 9949 13571 13600 14349 16994 17882 21107 21305 24110 24281
1415 4432 6404 7018 10794 12967 15336 16086 18241 19306 21213 22093
4167 4280 4929 4950 6643 9022 17030 17205 19445 20881 22678 24077
1812 6248 6683 7621 8726 13474 14664 15029 15949 20484 23069 24146
1553 4371 5291 7624 8369 12217 12502 12583 13031 19776 22479 23013
8 2805 3767 8608 9463 11572 13870 15406 16869 19027 19980 24586
1818 1874 2110 4613 6487 7224 14155 14295 20169 20226 24628 25760
4220 6249 12431 15579 16982 17754 18174 18532 19503 20304 20718 20990
947 981 2068 2617 3542 6488 13023 15530 19507 19977 20722 21260
2814 4849 5829 7501 14442 15506 16426 17560 20680 21655 21920 23305
7 5115 7788 12129 13067 13711 14689 16032 20143 20446 20660 24232
1307 5173 7668 10268 10968 11101 12953 13654 16395 19507 25401 25404
3 66 1625 8585 11357 12702 13287 14964 16610 18527 20961 21771
448 2453 5204 10643 11729 12590 14828 15422 16434 17543 19834 20231

TABLE 1-continued 6449 8048 8524 10455 13086 15586 16664 19441 20901 23170 25708 25859
6 1977 3407 3962 6229 7365 11419 12341 16107 18360 23275 23894
4 71 962 6399 6524 6590 9245 9967 13008 14082 18454 18917
8 27 6373 7033 11751 18693 18861 21275 22883 24216 24366 24418
64 650 5561 7545 13030 15420 17359 18182 20500 21193 22374 23173
4122 5792 11210
5868 9919 10606
3548 9043 24036
10531 20824 24231
12974 16474 24561
6835 15985 17032
6486 7688 11207
1001 6483 17352
19453 21954 24814
388 5878 6620
4321 6685 12605
15532 18878 22727
95 4074 21010
24 1449 21095
5732 5787 21031
14052 21118 22883
1277 4555 15976
2131 14871 19508
26 16749 20090
6509 11083 18303
1828 2969 25240
1563 12973 17966
11905 13176 18515
10569 11701 15655
5316 8695 19458
6330 19445 22931
12274 12966 13750
6545 13944 23585
2091 12976 24660
6501 18390 24255
3230 8792 12992
11530 12561 23764
524 2569 18992
6246 12960 13082
9933 21798 23789
10298 17400 25810
50 324 20781
6273 14257 23854
8193 13031 19453
4025 11432 20118
13699 15403 25227
6025 14453 19452
19098 19465 22029
6524 13300 15645
10108 20846 22452
3028 6527 24879
1589 18042 20967
11794 19070 23250
6504 12992 15212
8 3171 7459
13355 15520 17438
12184 22327 24359
133 17306 22042
8623 11511 12971
2841 12934 23320
3875 13011 20825
11047 12966 25484
6491 7073 8539
6521 13861 19465
6545 15214 21454
9768 19472 21803
6546 8893 14660
1171 12973 23624
6482 8991 12988
13007 15030 19463
6511 15494 24552
40 6533 13022
13012 24346 25124
6487 8745 16529
13021 19079 21636
69 12963 13018
6506 6536 8224
3889 19054 19458
4787 4988 19469
24 5844 23621

TABLE 1-continued 11508 16029 19446
55 1042 6547
14398 14427 23730
38 49 19449
6544 13010 15495
4036 7734 12651
57 12981 22287

TABLE 2

1096 5305 7922 9029 9900 11901 13025 13052 13129 13325 13655 14723
1394 1860 6369 7264 8430 9676 10812 15647 18305 23208 23745 23826
770 2568 3964 5173 6526 6920 7003 10710 12819 15549 16488 25759
51 693 3004 9322 10614 11173 14481 15351 17204 24347 24595 25066
5823 6733 8535 11633 12278 13266 14804 16227 18147 21946 22918 25486
3435 3718 4487 4955 5256 8584 12007 13417 14215 17230 19400 20982
844 1833 6682 6715 7028 9774 10242 16051 18866 22429 23751 24727
330 1481 2318 3851 4719 5306 11620 11809 13829 13992 19885 25341
2231 3656 4723 7860 12123 13390 16365 17923 19086 23028 23324 23984
515 3130 13252 14250 16261 16907 18400 18900 20512 22911 23030 23761
4449 6633 13133 16253 20114 21157 21213 21287 23287 23942 24401 24811
1365 1560 2416 3866 4743 6641 12645 12802 13978 21478 22017 22564
996 1168 2095 2393 2846 4283 10876 11528 12414 15516 19867 23249
2278 3803 3922 8045 10512 11485 11605 13057 19340 21857 21971 23766
2252 3454 5978 6040 8378 11319 12461 13080 16013 19436 20070 22569
2346 2879 7004 8175 8227 8589 8850 9291 12756 15786 16971 23159
81 1790 1976 3361 7529 7902 8299 11663 13327 14484 16468 20032
1284 3267 3647 4207 4834 5596 9554 11103 16921 20328 20697 23312
890 10978 12966 13432 16008 20137 20523 21172 23970 25157 25430 25759
7192 13142 15433 15507 15786 19229 19941 20456 20638 21009 25255 25838
678 1316 1858 5998 7537 8281 10923 15597 17389 18691 22102 25100
5819 6861 10626 10992 11039 13808 16495 16523 17437 20789 23463 24419
468 1289 4394 10112 10247 11168 15397 22042 22099 24220 24531 25142
1558 3264 3909 4121 6949 7547 9255 9428 9978 14409 19324 23040
3270 7693 10988 11129 12729 13188 13226 13386 17316 17549 21330 23577
924 3985 7216 8509 8931 9366 13032 17083 17111 19413 24966 24970
2589 7528 14343 15335 16060 17746 18259 20225 21262 23463 23524 25807
13718 18101 23423
3179 16321 23323
11120 14943 15049
10879 19035 21668
2393 8558 22850
6706 19748 24659
10136 15125 20390
9513 15535 18696
3964 5032 12598
10242 23055 25367
650 7353 20597
3162 11002 23839
2153 3077 20395
683 1000 13632
13182 17324 21766
5786 9155 19620
8529 11438 17005
217 5946 25640
6123 9532 17184
8975 10931 16954
14656 16394 22092
6145 13246 22376
18444 18915 21312
2115 14365 24194
11032 18236 20659
14486 22575 24669
15679 20943 25653
6881 7592 20934
777 14645 22876
8470 11263 17125
11159 22718 24692
18809 22677 23161
6430 15890 19898
10721 15342 19263
637 12008 19972
3327 14142 17132
6626 8278 17470
579 20337 25099
3141 13081 14315
9504 17357 23204

TABLE 2-continued 16253 20890 24073
1876 16146 21682
5310 5571 22570
17297 19348 19472
7100 13243 18153
8567 16070 17399
4279 13069 20035
14532 22925 25387
3579 4166 12336
108 2130 7119
12189 13790 16122
12757 16705 25768
372 8248 18808
3107 10254 19423
3839 22965 23458
545 3895 10707
5271 11433 21752
798 1056 17532
471 754 15973
1425 11664 23858
20057 20639 21091
13907 14433 19007
16080 20032 24955
1398 14507 19154
6916 17780 24110
416 16393 17534
9800 10659 22341
13674 17377 17743
163 13792 19756
1421 12948 19238
2714 19233 25264
3113 15257 24463
2182 2532 9118
8647 12629 16846
3275 17252 18700
3529 18768 20538
2290 9906 11818
824 2180 10139
12309 17149 25813
2093 5279 20214
3843 19791 25029

In addition, a DVB-S2 LDPC code having the following parameters was designed. For example, $N_1=16200, K_1=9720, M_1=360, q=18$ To design rate-⅗ DVB-S2 LDPC codes having the above parameters, parity-check matrixes shown in Table 3 through and Table 6, for example, can be obtained from a quasi-cyclic LDPC code having a total of $N_1/M_1=45$ column blocks and $q=(N_1-K_1)/M_1=18$ row blocks by applying the DVB-S2 LDPC code design process. It is noted that an $i^{th}$ weight-1 position sequence in an $i^{th}$ column sequentially represents the information on the positions of rows with 1 in an $i^{th}$ column group.

TABLE 3

71 1478 1901 2240 2649 2725 3592 3708 3965 4080 5733 6198
393 1384 1435 1878 2773 3182 3586 5465 6091 6110 6114 6327
160 1149 1281 1526 1566 2129 2929 3095 3223 4250 4276 4612
289 1446 1602 2421 3559 3796 5590 5750 5763 6168 6271 6340
947 1227 2008 2020 2266 3365 3588 3867 4172 4250 4865 6290
3324 3704 4447
1206 2565 3089
529 4027 5891
141 1187 3206
1990 2972 5120
752 796 5976
1129 2377 4030
6077 6108 6231
61 1053 1781
2820 4109 5307
2088 5834 5988

TABLE 3-continued 3725 3945 4010
1081 2780 3389
659 2221 4822
3033 6060 6160
756 1489 2350
3350 3624 5470
357 1825 5242
585 3372 6062
561 1417 2348
971 3719 5567
1005 1675 2062

TABLE 4

659 1334 1693 1719 2350 3788 4895 5431 5742 6060 6108 6448
289 888 1831 2534 3463 4498 4644 4900 5219 5790 5807 6297
845 991 2062 2965 3317 3800 3864 4617 4695 4858 5138 5925
245 1065 1616 3372 3996 4263 4556 5117 5311 5732 6160 6469
140 731 1139 1525 2493 2995 3558 3952 4678 5328 5834 5982
197 240 656 1116 1576 2143 2445 2500 5079 5306 5376 6268
4468 5237 5679
751 4161 4667
1343 6014 6109
3445 3567 5589
2731 4932 5866
5 1128 3565
42 3323 3392
2666 4713 6119
946 3479 4265
356 3010 5443
5469 6142 6319

TABLE 4-continued 3008 5768 6061
694 2127 3324
2225 3398 5310
1330 2007 3728
293 1989 6192
1349 2713 5119
879 1416 1770
1906 4414 5987
1382 2402 6069
2269 5136 5716

TABLE 5

237 688 782 1184 1683 1946 2681 3955 4458 4582 4709 5352
181 801 882 1771 2190 2427 3206 3569 3934 4553 5218 6344
158 555 1371 1429 1495 2713 3274 4450 4968 5982 5987 6287
196 694 1375 1863 2272 3383 3794 4124 4128 4359 4961 5070
436 1147 1494 2415 2746 3281 3311 4130 4191 5077 5236 6199
330 354 488 536 1045 1052 1527 2165 2349 2520 3865 4403
139 256 1015 1499 2148 2511 3056 3863 3871 4878 5096 5865
2361 3738 6118
431 1322 6382
4124 4264 5950
1329 1482 3097
293 584 3557
2740 3951 5612
1209 5305 5994
1568 3697 5651
1905 3514 3702
355 1348 4025
2220 4940 5270
653 2863 5903
1342 1699 6120
750 1575 3728
1043 1127 5763
1003 3352 5678
945 2993 3076
753 957 5731
2916 4008 4272
878 1396 3061

TABLE 6

242 1940 2093 3364 3493 3738 3952 5305 5443 5583 5708 6027
355 1348 1868 2382 2471 3702 3863 4438 5109 5188 5742 6266
1173 1635 2046 2076 2349 2879 3716 4118 4141 4495 4808 5320
978 1865 2199 2259 2684 4414 4570 4626 5119 5891 6099 6137
554 581 584 1342 1381 1672 4008 5173 5260 5633 5652 6249

TABLE 6-continued 157 200 1472 2068 2201 2829 2852 3322 3429 3547 4302 6293
203 1575 2297 2347 2742 2810 5201 5311 5613 5637 6060 6142
786 1482 1487 1519 1707 1972 3793 4414 4591 5650 5678 6228
1526 2393 3735
3121 4263 5251
1631 2636 3371
1061 1146 4503
410 1374 2088
148 2270 4780
1675 3753 3787
3714 4589 6148
234 1222 5981
1328 2143 5250
1557 3526 3728
875 1347 5421
2006 3869 4684
2976 4027 6159
657 2916 4819
1416 3316 6405
212 1988 5888
353 3166 5767
239 4123 5788

Figure 9:
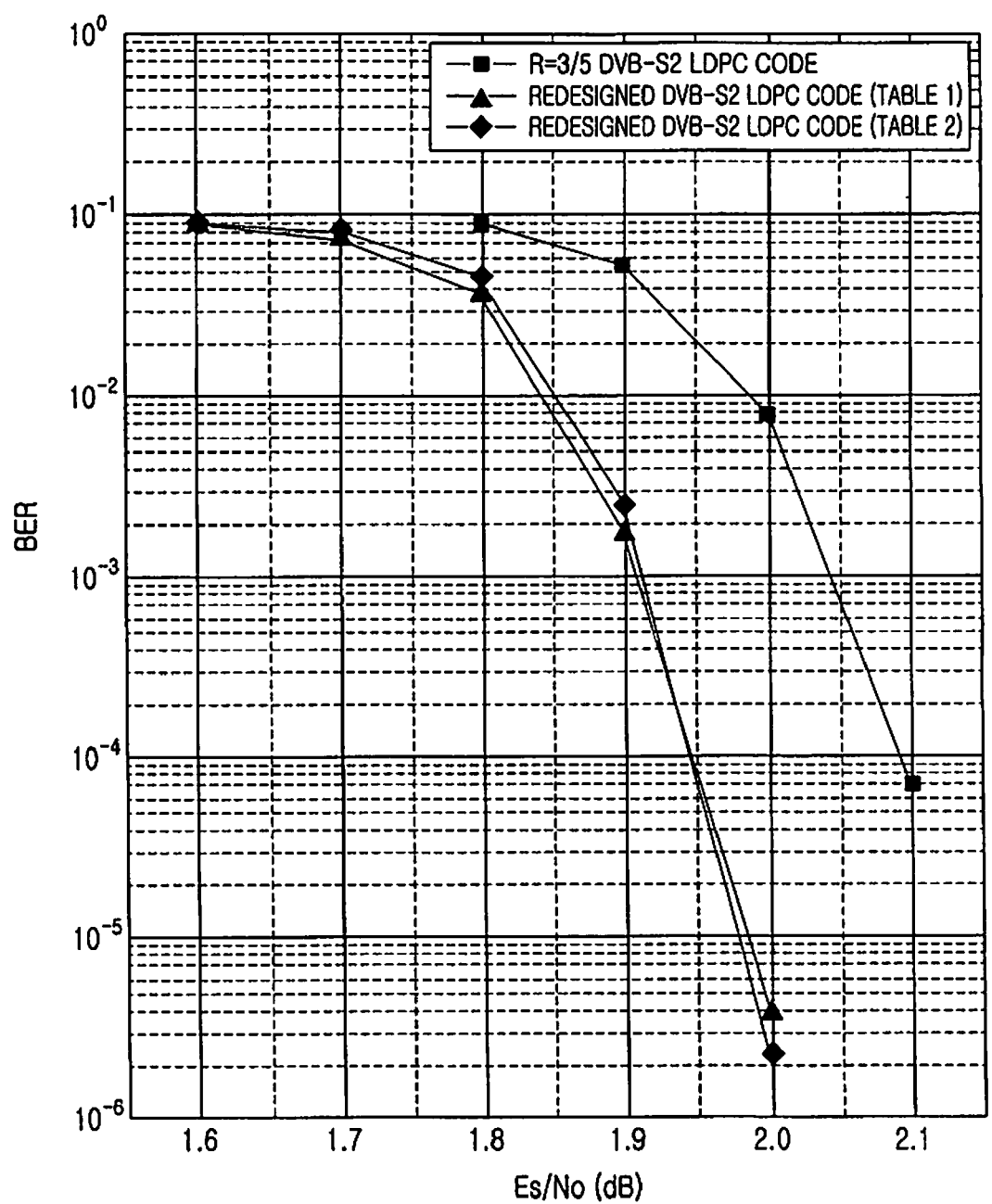
FIG. 9 is a diagram illustrating a computer simulation result on the DVB-S2 LDPC code, according to an embodiment of the present invention.

A performance comparison between the newly designed DVB-S2 LDPC code and the existing DVB-S2 LDPC code is shown in FIG. 9. FIG. 9 is a diagram illustrating a computer simulation result on the DVB-S2 LDPC code according to an embodiment of the present invention.

It can be appreciated that when an Additive White Gaussian Noise (AWGN) channel uses a Binary Phases Shift Key (BPSK) modulation scheme, performance improvement of approximately 0.15 dB is made at $BER=10^{-4}$. The performance improvement of a rate-⅗ DVB-S2 LDPC code can be achieved by simply changing information about the parity-check matrix as shown in Table 1 through Table 6.

The DVB-S2 LDPC code design process described with reference to FIG. 8 can be used not only for the code rate of ⅗ but also for other code rates. A DVB-S2 LDPC code having the following parameters was designed as an example for designing a DVB S2 LDPC code having another code rate.

$N_1=64800$, $K_1=43200$, $M_1=360$, $q=60$

To design rate-⅔ DVB-S2 LDPC codes having the above parameters, parity-check matrixes shown in Table 7 through and Table 10, for example, can be obtained from a quasi-cyclic LDPC code having a total of $N_1/M_1=180$ column blocks and $q=60$ row blocks by applying the DVB-S2 LDPC code design process of FIG. 8.

TABLE 7

1264 2463 2556 3073 4370 12739 15418 16124 19807 19841 21010 21125 21171
113 1852 3132 4996 5975 9197 9655 11694 13480 17613 18031 20266 20346
444 3661 3722 5295 7401 8545 9028 10608 11828 14216 15585 20012 20577
90 2079 6806 7162 7889 10969 11718 13211 13963 14300 15009 19379 20487
2281 4322 5742 6974 7537 8903 13268 13439 17747 19986 20312 21388 21514
271 1258 1720 1865 4339 7416 8198 8276 9832 14358 15553 15923 19689
467 3367 3840 4942 6852 7525 8146 12648 14794 16503 17426 18327 19041
1371 1602 11655 12611 14689 15360 15584 16913 18210 18357 18680 18734 19418
3500 7181 7332 7679 9399 10942 11205 12514 17057 17928 18245 18264 20196
187 961 1803 3439 3794 4518 8365 11201 14023 15238 16136 19487 20296
455 4544 5241 7450 9100 11606 11948 14433 14874 15628 16082 17704 19351
695 1929 5346 5497 7349 12046 17357 17372 17631 18109 18267 18475 19273
1298 2951 17635
495 650 11677
653 6222 14805

TABLE 7-continued

| | | | |
|---|---|---|---|
| 2274 9690 9743 | 11297 12566 14567 | 7281 17654 18609 | 2473 4923 14331 |
| 8760 14044 16012 | 8090 8146 19442 | 3449 12890 14460 | 839 6233 7840 |
| 8056 12933 15269 | 8493 10366 12434 | 701 9649 19076 | 1398 10270 13605 |
| 4243 9339 12774 | 3696 7696 15628 | 243 3130 11099 | 2097 4649 11467 |
| 2312 12024 20290 | 261 617 13196 | 7141 9684 10778 | 3530 5765 8743 |
| 4289 7187 16359 | 2958 5334 16260 | 10522 11425 13137 | 15475 16902 19208 |
| 1641 9284 17750 | 16845 17701 19088 | 5056 17464 21164 | 6993 12521 13333 |
| 7204 12854 14335 | 2552 16078 21113 | 542 4952 18819 | 5740 12083 19726 |
| 7387 8400 14186 | 3517 19451 20524 | 2616 4435 17063 | 3732 6440 7141 |
| 13818 16533 17156 | 11543 12109 12852 | 3348 5781 20818 | 9088 9154 12468 |
| 1677 1816 3263 | 5479 13538 18909 | 7087 11933 17417 | 2869 4396 8334 |
| 13150 13303 19272 | 2812 10594 11226 | 2812 3810 17336 | 6532 9457 14387 |
| 4433 16449 17397 | 6067 13659 19220 | 4328 11051 16035 | 1824 15244 20490 |
| 2188 5399 6750 | 6052 15205 17475 | 14374 15355 19910 | 4762 5874 12092 |
| 1625 7808 13669 | 3867 8650 17070 | 786 2520 7181 | 3231 8278 11367 |
| 1550 13884 17080 | 12553 20803 21588 | 17949 18263 19304 | 617 1563 2558 |
| 397 1801 7368 | 2411 3051 3354 | 5927 8048 13352 | 13411 15600 20409 |
| 2078 6302 14741 | 12454 18224 18506 | 504 7858 10998 | 3199 10422 11726 |
| 1153 2182 12546 | 4764 12313 16627 | 5135 13350 13392 | 889 7870 17425 |
| 8916 10519 12615 | 2562 8849 13143 | 3267 5581 21485 | 255 4679 20435 |
| 2255 10785 10851 | 6887 14015 18545 | 2318 10942 16588 | 4184 5153 19022 |
| 11862 15991 19165 | 10191 10519 13960 | 1460 19516 21166 | 4031 5859 18296 |
| 10594 13083 18567 | 8780 11212 18703 | 4248 14884 19339 | 2069 3014 13605 |
| 9659 13315 19220 | 4451 10126 19926 | 3565 9362 19476 | 4761 7956 14946 |
| 4411 13061 16858 | 273 6075 16827 | 703 4291 20357 | |
| 3702 7702 16415 | 5188 11832 21198 | 1154 6086 20199 | |
| 4420 5825 8937 | 6631 12585 17797 | 3537 14257 17073 | |

TABLE 8

1970 4567 4933 5884 6610 7776 10431 11744 13263 15185 15418 18761 19939
293 1566 2735 3136 3346 4434 6552 9213 9220 9655 10192 11551 12377
5545 5805 6688 7676 7737 10608 10821 13742 16155 16472 16644 18128 18961
131 1669 2487 2683 9920 11546 14178 17549 17589 18939 18990 20099 20602
827 6988 7559 8262 8543 9157 12214 13501 14702 14886 17612 19568 20174
319 2949 3176 4458 4660 4693 6516 9358 9638 12451 17363 19072 20465
2247 3685 5887 8220 10161 11846 11866 12423 16968 19067 19932 20074 21262
71 2475 5382 8654 11157 12390 13980 14600 15104 15231 15533 16538 17929
2064 2819 4476 4882 9394 11660 12948 14705 15977 19965 20172 20801 20859
187 356 2581 3794 4518 6079 8563 8698 10276 10345 10541 12483 18467
455 584 4674 5920 7810 10408 11606 12308 15484 16653 17882 18211 19101
329 1566 2026 3927 6673 9595 10251 12409 17357 18729 18992 19955 20017
2635 3398 12371
495 650 19537
8865 11142 14333

| | | | |
|---|---|---|---|
| 13050 14094 20783 | 9266 11297 21407 | 3141 17654 18609 | 2473 4923 21591 |
| 8760 12712 18364 | 6646 8090 11522 | 3449 6960 19670 | 839 7073 11080 |
| 2729 9916 19353 | 2866 4694 20733 | 1669 5981 10196 | 1398 3610 20085 |
| 5259 8623 12774 | 3696 11956 15388 | 3130 8939 21543 | 2097 4649 11467 |
| 2170 10952 21564 | 617 14721 21296 | 7141 9684 16118 | 3530 7325 10063 |
| 2129 7547 10119 | 2958 5334 16260 | 7617 13945 21502 | 15475 16902 19208 |
| 8721 10184 17750 | 12825 19088 19681 | 5056 17464 18584 | 573 5261 13333 |
| 10495 12854 21364 | 10438 14633 18512 | 542 4952 10059 | 10600 12083 19726 |
| 4087 5966 8400 | 6484 16837 19451 | 2616 4435 20843 | 2120 3732 9721 |
| 7616 17373 19278 | 5449 12852 16223 | 2988 13341 20818 | 9088 9274 12048 |
| 1816 8423 20097 | 3079 13538 18909 | 4253 13327 17417 | 4396 8334 14869 |
| 13150 14683 19272 | 10746 11554 11692 | 1312 13350 17336 | 6532 13357 14387 |
| 4433 16449 17397 | 6067 7299 12860 | 4328 11051 16035 | 1410 1824 15244 |
| 6750 7799 17848 | 15205 17595 21052 | 12410 15355 18334 | 562 5874 12092 |
| 7808 16309 16745 | 30 6670 11367 | 3401 17286 19020 | 3231 17338 21387 |
| 13600 13910 18384 | 7488 9943 12433 | 743 17624 19089 | 617 1563 9938 |
| 3301 19057 21168 | 2411 3354 15051 | 5927 8048 18092 | 13411 15600 20409 |
| 7301 17498 20702 | 3524 4834 13406 | 10998 13344 15958 | 3199 4782 17486 |
| 7522 12546 15253 | 12313 16627 18444 | 4775 13350 13392 | 7870 14029 17425 |
| 3576 10519 12555 | 10662 14883 17849 | 5581 9087 21485 | 8039 10875 20435 |
| 1115 6225 9591 | 1475 13967 18545 | 2318 5842 16588 | 5153 17924 19022 |
| 11971 12462 14005 | 10780 11479 15231 | 7486 8840 19516 | 1976 7899 15311 |
| 6334 8727 10383 | 472 14743 17420 | 1728 14224 19339 | 2069 3014 13605 |
| 1435 9659 15260 | 4126 4451 19926 | 9362 13645 19476 | 2241 7956 14946 |
| 4781 9118 12691 | 9153 12495 16827 | 4291 16063 20357 | |
| 16595 16762 20022 | 9148 11832 21198 | 1154 6219 13646 | |
| 8937 12665 15700 | 4951 5745 14797 | 1057 12357 17073 | |

TABLE 9

2599 2998 3291 3793 4567 5644 7476 8945 9250 11630 12041 12344 19983
113 5946 6640 7426 7577 10233 10831 12335 15672 15976 17995 20152 20514
1944 3315 4168 6117 6661 8745 10508 10608 10821 11636 12212 15145 19082
5549 7899 10946 11962 12090 17083 17847 18440 19631 20039 20089 20589 21258
239 3726 7468 7981 10028 11317 12462 15272 17747 19262 19403 20174 21514
563 2018 3439 4693 5458 7056 9391 9665 9832 10569 13076 14598 18340
467 5607 5665 6934 8062 9706 10101 10572 12288 15067 16083 17520 20906
311 1489 2790 3597 14820 15231 15255 15398 17333 18042 18224 18680 19454
2399 4145 4176 4659 6197 11205 12514 12620 17261 17928 20292 21384 21442
2716 3794 6478 7567 10083 10345 10541 13543 16561 16638 17876 19459 19487
2034 3004 6284 9100 11606 12393 13821 14548 14731 15790 16208 19442 21095
695 895 3606 5787 6673 7232 7357 7546 13517 14409 17631 18089 18109
1871 17078 17635
650 3495 19537
13253 14562 21465

| | | | |
|---|---|---|---|
| 17010 18503 21534 | 4877 11066 14567 | 13694 17241 18609 | 8463 14331 19453 |
| 772 8760 14044 | 2450 8146 19442 | 3449 6960 19670 | 839 6233 11080 |
| 15796 17669 19353 | 9466 10514 20733 | 5801 8809 15536 | 1398 10270 18705 |
| 4303 9339 12774 | 3696 5116 15388 | 243 3130 11099 | 2097 4649 11467 |
| 9864 10810 18992 | 681 12437 13196 | 7141 8258 9684 | 3530 11143 16025 |
| 1649 11507 16359 | 4638 5334 16260 | 10462 13945 14037 | 11515 16902 19208 |
| 530 11504 17421 | 285 11341 19088 | 15496 17464 21164 | 573 12521 13333 |
| 3374 3415 20944 | 9653 12212 16078 | 11019 13382 21452 | 6803 19726 21100 |
| 7387 9000 18446 | 16837 19451 20524 | 2616 4435 18743 | 3732 7141 21140 |
| 4196 15198 17373 | 5063 6192 12109 | 5781 6528 20818 | 9088 9274 20868 |
| 1283 9297 11956 | 18458 18909 20899 | 3847 12353 14717 | 4396 8334 19189 |
| 252 7903 13630 | 2812 11226 11554 | 2812 13350 17336 | 6532 7897 14387 |
| 14813 16449 17397 | 6067 6800 15459 | 3555 4328 11051 | 1824 15244 17730 |
| 5399 12210 17848 | 11692 15205 17475 | 12410 14455 20434 | 4762 5874 7472 |
| 7808 10729 11165 | 1587 4410 5230 | 786 2520 19841 | 12831 17338 19527 |
| 9580 13910 15084 | 10333 12223 14508 | 743 4509 16724 | 1563 14138 14357 |
| 5317 6901 10368 | 2411 3354 14871 | 3467 8048 18092 | 13411 15600 20409 |
| 1802 8681 17498 | 2074 5744 16166 | 7858 10998 13344 | 3199 10422 11726 |
| 8593 12546 13042 | 16627 18444 19813 | 4775 10872 19350 | 889 7870 17425 |
| 679 5175 14436 | 3629 10662 13143 | 5581 7407 21485 | 1995 3599 14195 |
| 875 10551 10785 | 1475 15605 15767 | 2318 5722 19708 | 15764 18173 19022 |
| 2905 13651 20802 | 4699 5500 18891 | 8840 12796 21166 | 3956 15311 20379 |
| 1414 4143 14967 | 4912 8900 19663 | 4248 14884 21559 | 2069 3014 20265 |
| 3440 9659 13315 | 2206 4451 19926 | 9362 13645 17616 | 3366 7956 9681 |
| 3811 8441 16858 | 6867 9153 13395 | 703 4291 11777 | |
| 3702 6622 16595 | 1392 8008 21198 | 219 13646 18614 | |
| 5825 8937 17080 | 637 4951 12585 | 3537 14257 17073 | |

TABLE 10

1798 2990 8470 9859 10627 10743 11271 12344 13993 14076 15185 15461 15784
455 3160 4973 9655 11973 16446 17717 19471 20034 20152 20266 20836 21072
321 3008 3315 10608 12212 13425 14216 15448 17244 17577 18205 18541 21542
409 1342 5051 7220 8083 8619 10047 10710 11546 15258 15989 16389 18179
1242 1866 2354 2912 3388 5194 6023 11522 12481 12577 14768 17747 20459
2589 2658 2816 3853 4625 7463 8378 9832 10951 11158 18499 18996 20320
2066 4383 5487 5785 6492 10161 10847 14794 16440 18427 19486 20088 20542
4358 5115 8693 8954 10964 12330 12791 13040 13860 14637 18042 19971 20269
3500 3899 4176 6521 6605 12317 14194 15339 17172 17928 20985 21322 21384
436 476 1154 3107 3127 3241 4278 4723 10541 12123 14278 16645 16759
455 1084 4082 5980 6284 7854 9931 10833 11710 12386 19708 21368 21561
2886 4287 6673 7546 8312 8317 9055 10397 11409 15351 16415 16489 16769
2738 12371 17635
495 650 3877
653 14562 14805

| | | | |
|---|---|---|---|
| 990 2274 3983 | 7826 11297 14807 | 7281 8174 18609 | 2473 4923 12231 |
| 8760 14044 16012 | 8090 16306 19442 | 5789 6960 20030 | 839 6173 20260 |
| 8056 8429 19353 | 434 9706 21093 | 1669 6221 19076 | 1398 2325 10270 |
| 2139 4303 12774 | 3696 11956 14788 | 243 3730 11099 | 2097 11467 16709 |
| 24 6850 8132 | 2237 13196 20481 | 8498 9684 12961 | 3530 10063 16025 |
| 7187 10709 16359 | 9138 15960 16494 | 9445 13137 21502 | 15475 16902 19208 |
| 164 8721 17750 | 3465 17701 19088 | 5056 17464 21164 | 12521 13333 19233 |
| 12854 14335 20944 | 5372 8633 16078 | 5492 7922 11019 | 7540 12083 19726 |
| 446 4627 8400 | 15877 19451 20524 | 4435 5616 14003 | 3732 7141 21140 |
| 3273 7616 12798 | 5063 12109 12852 | 8901 13548 20818 | 6448 9694 20868 |
| 1816 13403 16677 | 6259 13538 18909 | 2573 17417 20347 | 4396 8334 19369 |
| 7903 13150 19272 | 11226 12574 21112 | 1230 2812 17336 | 2272 14387 20257 |
| 4433 16449 17397 | 8707 12860 21399 | 4328 11051 16035 | 1410 1824 15244 |
| 5399 8730 15748 | 5812 17475 19165 | 12410 15355 20614 | 4762 5874 14972 |
| 11165 16568 21349 | 30 3747 5230 | 786 2520 7181 | 3231 17338 21387 |
| 2630 14860 18384 | 12223 12433 21588 | 6669 17843 19304 | 617 1563 10298 |
| 3301 5028 11677 | 2411 3354 6891 | 5927 8048 14312 | 13411 15600 20409 |

TABLE 10-continued

| | | | |
|---|---|---|---|
| 12782 14741 17498 | 2074 5744 17726 | 7858 10998 13344 | 3199 10422 14006 |
| 742 1153 12546 | 6024 12313 16987 | 4775 6030 13392 | 889 7870 17425 |
| 739 10596 12615 | 4469 10662 13143 | 4347 5581 21485 | 255 3599 8495 |
| 1115 10551 21585 | 5075 6887 18545 | 2318 7822 16588 | 5153 6044 19022 |
| 6085 8791 12462 | 4420 5479 10191 | 4906 8840 9916 | 639 1196 3431 |
| 10227 13083 21274 | 5743 9172 17420 | 4248 19339 20404 | 1274 2069 13605 |
| 9659 13315 15260 | 7811 16246 19926 | 9362 10956 17125 | 7956 9681 14946 |
| 1891 5038 15641 | 9153 13395 13707 | 16891 18163 20357 | |
| 16762 18695 19602 | 138 20052 21388 | 219 1154 13646 | |
| 1180 5825 18717 | 637 7831 12585 | 3537 10837 17073 | |

Figure 10:
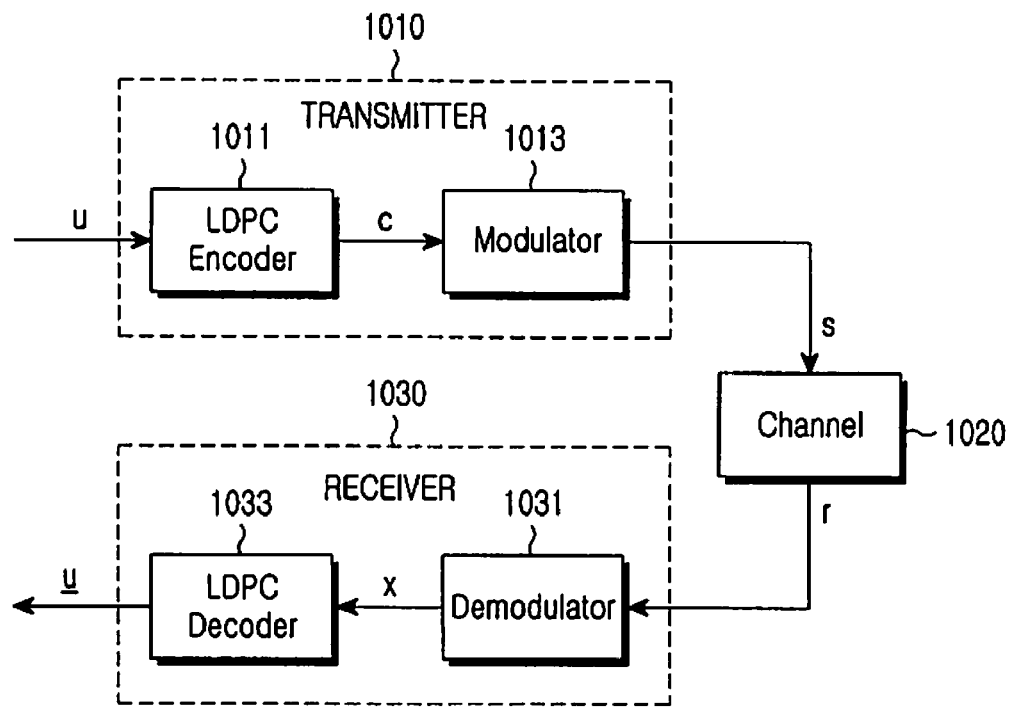
FIG. 10 is a block diagram illustrating a structure of a transceiver in a communication system using the redesigned DVB-S2 LDPC code, according to an embodiment of the present invention.

FIG. 10 is a block diagram illustrating a structure of a transceiver in a communication system using the redesigned DVB-S2 LDPC code, according to an embodiment of the present invention.

Referring to FIG. 10, a message u is input to an LDPC encoder 1011 in a transmitter 1010 before being transmitted to a receiver 1030. Then the LDPC encoder 1011 encodes the input message u and provides the encode signal c to a modulator 1013. The modulator 1013 modulates the encoded signal and transmits the modulated signal s to the receiver 1030 through a wireless channel 1020. Then a demodulator 1031 in the receiver 1030 demodulates the signal r transmitted by the transmitter 1010, and outputs the demodulated signal x to an LDPC decoder 1033. Then the LDPC decoder 1033 calculates an estimation value $\bar{u}$ of the message from the data received through the wireless channel.

Figure 11:
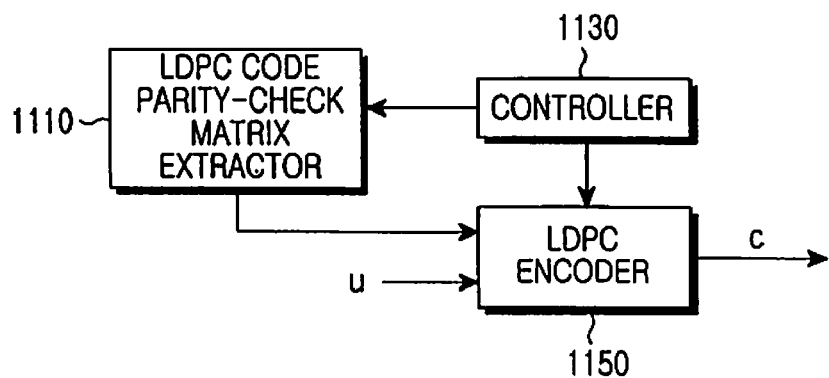
FIG. 11 is a block diagram illustrating a structure of a transmission apparatus using an LDPC code, according to an embodiment of the present invention.

A detailed structure of a transmission apparatus in the communication system using the redesigned DVB-S2 LDPC code is shown in FIG. 11. FIG. 11 is a block diagram illustrating a structure of a transmission apparatus using the redesigned LDPC code according to an embodiment of the present invention.

The transmission apparatus includes a controller 1130, an LDPC code parity-check matrix extractor 1110 and an LDPC encoder 1150.

The LDPC code parity-check matrix extractor 1110 extracts an LDPC code parity-check matrix according to the requirements of the system. The LDPC code parity-check matrix can be extracted from the sequence information shown in Table 1 through Table 10, can be extracted using a memory in which the parity-check matrix is stored, can be given in the transmission apparatus, or can be generated in the transmission apparatus.

The controller 1130 is adapted to determine a necessary parity-check matrix according to a code rate, a codeword length, or an information length to meet the requirements of the system.

The LDPC encoder 1150 performs encoding based on the LDPC code parity-check matrix information read by the controller 1130 and the LDPC code parity-check matrix extractor 1110.

Figure 12:
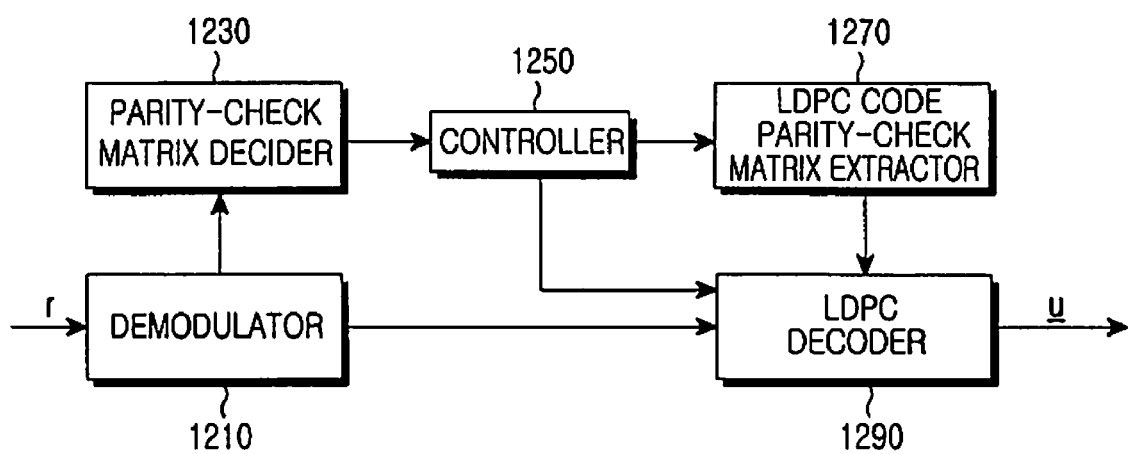
FIG. 12 is a block diagram illustrating a structure of a reception apparatus using an LDPC code, according to an embodiment of the present invention.

FIG. 12 is a block diagram illustrating a structure of a reception apparatus according to an embodiment of the present invention.

FIG. 12 illustrates a reception apparatus for receiving the signal transmitted from the communication system using the redesigned DVB-S2 LDPC code and recovering user-desired data from the received signal.

The reception apparatus includes a controller 1250, a parity-check matrix decider 1230, an LDPC code parity-check matrix extractor 1270, a demodulator 1210 and an LDPC decoder 1290.

The demodulator 1210 demodulates a received LDPC code, and provides the demodulated signal to the parity-check matrix decider 1230 and the LDPC decoder 1290.

The parity-check matrix decider 1230, under the control of the controller 1250, decides the parity-check matrix of the LDPC code used in the system based on the demodulated signal.

The controller 1250 provides the decision result from the parity-check matrix decider 1230 to the LDPC code parity-check matrix extractor 1270 and the LDPC decoder 1290.

The LDPC code parity-check matrix extractor 1270, under the control of the controller 1250, extracts the parity-check matrix of the LDPC code required by the system, and provides the extracted parity-check matrix to the LDPC decoder 1290. As stated above, the parity-check matrix of the LDPC code can be extracted from the sequence information shown in Table 1 through Table 10, can be extracted using a memory in which the parity-check matrix is stored, can be given in the transmission apparatus, or can be generated in the transmission apparatus.

The LDPC decoder 1290, under the control of the controller 1250, performs decoding based on the received signal provided from the demodulator 1210 and the information on the LDPC code's parity-check matrix provided from the LDPC code parity-check matrix extractor 1270.

Figure 13:
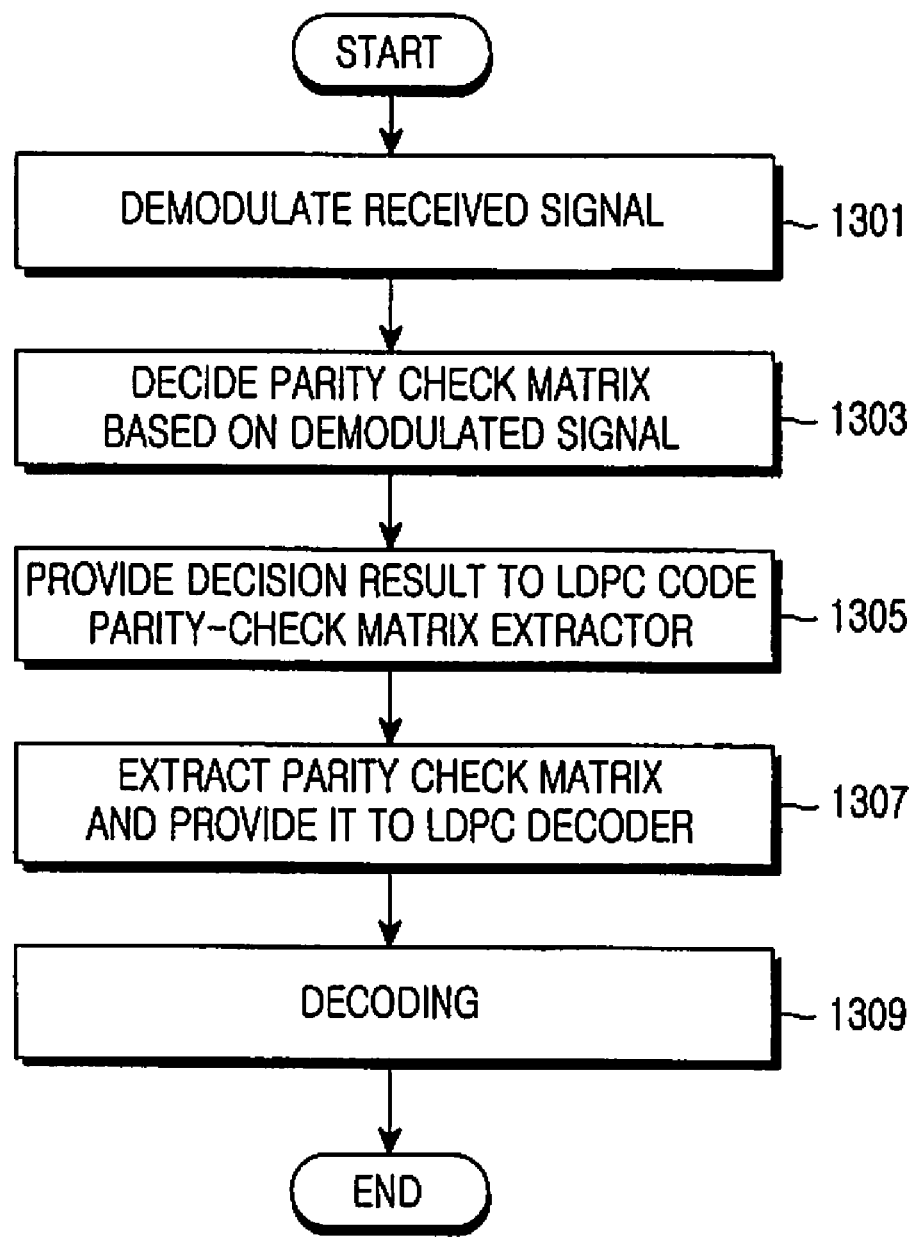
FIG. 13 is a flowchart illustrating a reception operation in a reception apparatus using an LDPC code, according to an embodiment of the present invention.

An operation flowchart of the reception apparatus in FIG. 12 is shown in FIG. 13.

In step 1301, the demodulator 1210 receives a signal transmitted from the communication system using the redesigned DVB-S2 LDPC code and demodulates the received signal. Thereafter, in step 1303, the parity-check matrix decider 1230 makes a decision on a parity-check matrix of the LDPC code used in the system based on the demodulated signal.

The decision result from the parity-check matrix decider 1230 is provided to the LDPC code parity-check matrix extractor 1270 in step 1305. The LDPC code parity-check matrix extractor 1270 extracts a parity-check matrix of the LDPC code required by the system, and provides it to the LDPC decoder 1290 in step 1307.

As mentioned above, the parity-check matrix of the LDPC code can be extracted from the sequence information shown in Table 1 through Table 10, can be extracted using a memory in which the parity-check matrix is stored, can be given in the transmission apparatus, or can be generated in the transmission apparatus.

Thereafter, in step 1309, the LDPC decoder 1290 performs decoding based on the information about the LDPC code's parity-check matrix provided from the LDPC code parity-check matrix extractor 1270.

As is apparent from the foregoing description, the present invention optimizes characteristics of the Tanner graph in designing the DVB-S2 LDPC code, thereby optimizing performance of the communication system using the LDPC code.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for generating a parity-check matrix of a Low-Density Parity-Check (LDPC) code, comprising the steps of:
   determining parameters for designing the LDPC code;
   forming a first parity-check matrix of a quasi-cyclic LDPC code according to the determined parameters;
   creating a second parity-check matrix through the elimination of a predetermined portion of a parity part in the first parity-check matrix; and
   creating a third parity-check matrix by rearranging the second parity-check matrix.

2. The method of claim 1, wherein creating a second parity-check matrix comprises:
   creating the second parity-check matrix through the elimination of '1' in a last column and a first row in the first parity-check matrix.

3. The method of claim 1, wherein creating a third parity-check matrix comprises:
   rearranging the second parity-check matrix in accordance with:
   with $0^{th}$ column through $(K-1)^{th}$ column in the second parity-check matrix being kept intact, $K_1^{th}$ column through $(N_1-1)^{th}$ column are rearranged so that a $(K_1+M_1 \cdot j+i)^{th}$ column is located in a $(K_1+q \cdot i+j)^{th}$ column, wherein $K_1$ denotes a length of an information word of the second parity-check matrix, $N_1$ denotes a length of a codeword, $0 \leq i < M_1$, $0 \leq j < q$, and $q=(N_1-K_1)/M_1$, where $M_1$, q and $K_1/M_1$ are integers; and
   $0^{th}$ row through $(N_1-K_1-1)^{th}$ row in the second parity-check matrix are rearranged so that an $(M_1 \cdot j+i)^{th}$ row is located in a $(q \cdot i+j)^{th}$ row, wherein $K_1$ denotes a length of an information word of the second parity-check matrix, $N_1$ denotes a length of a codeword, $0 \leq i < M_1$, $0 \leq j < q$, and $q=(N_1-K_1)/M_1$, and $M_1$, where q and $K_1/M_1$ are integers.

4. The method of claim 1, wherein the third parity-check matrix is created as defined in the following table:

---

71 1478 1901 2240 2649 2725 3592 3708 3965 4080 5733 6198
393 1384 1435 1878 2773 3182 3586 5465 6091 6110 6114 6327
160 1149 1281 1526 1566 2129 2929 3095 3223 4250 4276 4612
289 1446 1602 2421 3559 3796 5590 5750 5763 6168 6271 6340
947 1227 2008 2020 2266 3365 3588 3867 4172 4250 4865 6290
3324 3704 4447
1206 2565 3089
529 4027 5891
141 1187 3206
1990 2972 5120
752 796 5976
1129 2377 4030
6077 6108 6231
61 1053 1781
2820 4109 5307
2088 5834 5988
3725 3945 4010
1081 2780 3389
659 2221 4822
3033 6060 6160
756 1489 2350
3350 3624 5470
357 1825 5242
585 3372 6062
561 1417 2348
971 3719 5567
1005 1675 2062.

---

5. The method of claim 4, wherein the third parity-check matrix is created as defined in the following table:

---

1096 5305 7922 9029 9900 11901 13025 13052 13129 13325 13655 14723
1394 1860 6369 7264 8430 9676 10812 15647 18305 23208 23745 23826
770 2568 3964 5173 6526 6920 7003 10710 12819 15549 16488 25759
51 693 3004 9322 10614 11173 14481 15351 17204 24347 24595 25066
5823 6733 8535 11633 12278 13266 14804 16227 18147 21946 22918 25486
3435 3718 4487 4955 5256 8584 12007 13417 14215 17230 19400 20982
844 1833 6682 6715 7028 9774 10242 16051 18866 22429 23751 24727
330 1481 2318 3851 4719 5306 11620 11809 13829 13992 19885 25341
2231 3656 4723 7860 12123 13390 16365 17923 19086 23028 23324 23984
515 3130 13252 14250 16261 16907 18400 18900 20512 22911 23030 23761
4449 6633 13133 16253 20114 21157 21213 21287 23287 23942 24401 24811
1365 1560 2416 3866 4743 6641 12645 12802 13978 21478 22017 22564
996 1168 2095 2393 2846 4283 10876 11528 12414 15516 19867 23249
2278 3803 3922 8045 10512 11485 11605 13057 19340 21857 21971 23766
2252 3454 5978 6040 8378 11319 12461 13080 16013 19436 20070 22569
2346 2879 7004 8175 8227 8589 8850 9291 12756 15786 16971 23159
81 1790 1976 3361 7529 7902 8299 11663 13327 14484 16468 20032
1284 3267 3647 4207 4834 5596 9554 11103 16921 20328 20697 23312
890 10978 12966 13432 16008 20137 20523 21172 23970 25157 25430 25759
7192 13142 15433 15507 15786 19229 19941 20456 20638 21009 25255 25838
678 1316 1858 5998 7537 8281 10923 15597 17389 18691 22102 25100
5819 6861 10626 10992 11039 13808 16495 16523 17437 20789 23463 24419
468 1289 4394 10112 10247 11168 15397 22042 22099 24220 24531 25142
1558 3264 3909 4121 6949 7547 9255 9428 9978 14409 19324 23040
3270 7693 10988 11129 12729 13188 13226 13386 17316 17549 21330 23577
924 3985 7216 8509 8931 9366 13032 17083 17111 19413 24966 24970
2589 7528 14343 15335 16060 17746 18259 20225 21262 23463 23524 25807
13718 18101 23423
3179 16321 23323
11120 14943 15049
10879 19035 21668
2393 8558 22850
6706 19748 24659
10136 15125 20390
9513 15535 18696

-continued 3964 5032 12598
10242 23055 25367
650 7353 20597
3162 11002 23839
2153 3077 20395
683 1000 13632
13182 17324 21766
5786 9155 19620
8529 11438 17005
217 5946 25640
6123 9532 17184
8975 10931 16954
14656 16394 22092
6145 13246 22376
18444 18915 21312
2115 14365 24194
11032 18236 20659
14486 22575 24669
15679 20943 25653
6881 7592 20934
777 14645 22876
8470 11263 17125
11159 22718 24692
18809 22677 23161
6430 15890 19898
10721 15342 19263
637 12008 19972
3327 14142 17132
6626 8278 17470
579 20337 25099
3141 13081 14315
9504 17357 23204
16253 20890 24073
1876 16146 21682
5310 5571 22570
17297 19348 19472
7100 13243 18153
8567 16070 17399
4279 13069 20035
14532 22925 25387
3579 4166 12336
108 2130 7119
12189 13790 16122
12757 16705 25768
372 8248 18808
3107 10254 19423
3839 22965 23458
545 3895 10707
5271 11433 21752
798 1056 17532
471 754 15973
1425 11664 23858
20057 20639 21091
13907 14433 19007
16080 20032 24955
1398 14507 19154
6916 17780 24110
416 16393 17534
9800 10659 22341
13674 17377 17743
163 13792 19756
1421 12948 19238
2714 19233 25264
3113 15257 24463
2182 2532 9118
8647 12629 16846
3275 17252 18700
3529 18768 20538
2290 9906 11818
824 2180 10139
12309 17149 25813
2093 5279 20214
3843 19791 25029.

6. The method of claim 4, wherein the third parity-check matrix is created as defined in the following table:

```
2599 2998 3291 3793 4567 5644 7476 8945 92501 1630 12041 12344 19983
113 5946 6640 7426 7577 10233 10831 12335 15672 15976 17995 20152 20514
1944 3315 4168 6117 6661 8745 10508 10608 10821 11636 12212 15145 19082
5549 7899 10946 11962 12090 17083 17847 18440 19631 20039 20089 20589 21258
239 3726 7468 7981 10028 11317 12462 15272 17747 19262 19403 20174 21514
563 2018 3439 4693 5458 7056 9391 9665 9832 10569 13076 14598 18340
467 5607 5665 6934 8062 9706 10101 10572 12288 15067 16083 17520 20906
311 1489 2790 3597 14820 15231 15255 15398 17333 18042 18224 18680 19454
2399 4145 4176 4659 6197 11205 12514 12620 17261 17928 20292 21384 21442
2716 3794 6478 7567 10083 10345 10541 13543 16561 16638 17876 19459 19487
2034 3004 6284 9100 11606 12393 13821 14548 14731 15790 16208 19442 21095
695 895 3606 5787 6673 7232 7357 7546 13517 14409 17631 18089 18109
1871 17078 17635
650 3495 19537
13253 14562 21465
17010 18503 21534    4877 11066 14567    13694 17241 18609    8463 14331 19453
772 8760 14044       2450 8146 19442     3449 6960 19670      839 6233 11080
15796 17669 19353    9466 10514 20733    5801 8809 15536      1398 10270 18705
4303 9339 12774      3696 5116 15388     243 3130 11099       2097 4649 11467
9864 10810 18992     681 12437 13196     7141 8258 9684       3530 11143 16025
1649 11507 16359     4638 5334 16260     10462 13945 14037    11515 16902 19208
530 11504 17421      285 11341 19088     15496 17464 21164    573 12521 13333
3374 3415 20944      9653 12212 16078    11019 13382 21452    6803 19726 21100
7387 9000 18446      16837 19451 20524   2616 4435 18743      3732 7141 21140
4196 15198 17373     5063 6192 12109     5781 6528 20818      9088 9274 20868
1283 9297 11956      18458 18909 20899   3847 12353 14717     4396 8334 19189
252 7903 13630       2812 11226 11554    2812 13350 17336     6532 7897 14387
14813 16449 17397    6067 6800 15459     3555 4328 11051      1824 15244 17730
5399 12210 17848     11692 15205 17475   12410 14455 20434    4762 5874 7472
7808 10729 11165     1587 4410 5230      786 2520 19841       12831 17338 19527
9580 13910 15084     10333 12223 14508   743 4509 16724       1563 14138 14357
5317 6901 10368      2411 3354 14871     3467 8048 18092      13411 15600 20409
1802 8681 17498      2074 5744 16166     7858 10998 13344     3199 10422 11726
8593 12546 13042     16627 18444 19813   4775 10872 19350     889 7870 17425
679 5175 14436       3629 10662 13143    5581 7407 21485      1995 3599 14195
875 10551 10785      1475 15605 15767    2318 5722 19708      15764 18173 19022
2905 13651 20802     4699 5500 18891     8840 12796 21166     3956 15311 20379
1414 4143 14967      4912 8900 19663     4248 14884 21559     2069 3014 20265
3440 9659 13315      2206 4451 19926     9362 13645 17616     3366 7956 9681
3811 8441 16858      6867 9153 13395     703 4291 11777
3702 6622 16595      1392 8008 21198     219 13646 18614
5825 8937 17080      637 4951 12585      3537 14257 17073.
```

7. The method of claim 4, wherein the third parity-check matrix has a plurality of column groups provided by grouping columns corresponding to an information word, each column group having a predetermined number of columns; and
wherein each row in the table includes sequence information indicating positions of rows where '1' is located in a corresponding column group of the parity-check matrix.

8. A method for encoding a channel in a communication system using a Low-Density Parity-Check (LDPC) code, comprising the steps of:
reading a stored parity-check matrix; and
LDPC-encoding a signal using the stored parity-check matrix;
wherein a code rate is ⅗ and a length of a codeword is 16200, the parity-check matrix is formed as defined in the following table:

```
71 1478 1901 2240 2649 2725 3592 3708 3965 4080 5733 6198
393 1384 1435 1878 2773 3182 3586 5465 6091 6110 6114 6327
160 1149 1281 1526 1566 2129 2929 3095 3223 4250 4276 4612
289 1446 1602 2421 3559 3796 5590 5750 5763 6168 6271 6340
947 1227 2008 2020 2266 3365 3588 3867 4172 4250 4865 6290
3324 3704 4447
1206 2565 3089
```

-continued
```
529 4027 5891
141 1187 3206
1990 2972 5120
752 796 5976
1129 2377 4030
6077 6108 6231
61 1053 1781
2820 4109 5307
2088 5834 5988
3725 3945 4010
1081 2780 3389
659 2221 4822
3033 6060 6160
756 1489 2350
3350 3624 5470
357 1825 5242
585 3372 6062
561 1417 2348
971 3719 5567
1005 1675 2062.
```

9. A method for encoding a channel in a communication system using a Low-Density Parity-Check (LDPC) code, comprising the steps of:
reading a stored parity-check matrix; and
LDPC-encoding a signal using the stored parity-check matrix;

wherein a code rate is ⅗ and a length of a codeword is 64800, the parity-check matrix is formed as defined in the following table:

```
1096 5305 7922 9029 9900 11901 13025 13052 13129 13325 13655 14723
1394 1860 6369 7264 8430 9676 10812 15647 18305 23208 23745 23826
770 2568 3964 5173 6526 6920 7003 10710 12819 15549 16488 25759
51 693 3004 9322 10614 11173 14481 15351 17204 24347 24595 25066
5823 6733 8535 11633 12278 13266 14804 16227 18147 21946 22918 25486
3435 3718 4487 4955 5256 8584 12007 13417 14215 17230 19400 20982
844 1833 6682 6715 7028 9774 10242 16051 18866 22429 23751 24727
330 1481 2318 3851 4719 5306 11620 11809 13829 13992 19885 25341
2231 3656 4723 7860 12123 13390 16365 17923 19086 23028 23324 23984
515 3130 13252 14250 16261 16907 18400 18900 20512 22911 23030 23761
4449 6633 13133 16253 20114 21157 21213 21287 23287 23942 24401 24811
1365 1560 2416 3866 4743 6641 12645 12802 13978 21478 22017 22564
996 1168 2095 2393 2846 4283 10876 11528 12414 15516 19867 23249
2278 3803 3922 8045 10512 11485 11605 13057 19340 21857 21971 23766
2252 3454 5978 6040 8378 11319 12461 13080 16013 19436 20070 22569
2346 2879 7004 8175 8227 8589 8850 9291 12756 15786 16971 23159
81 1790 1976 3361 7529 7902 8299 11663 13327 14484 16468 20032
1284 3267 3647 4207 4834 5596 9554 11103 16921 20328 20697 23312
890 10978 12966 13432 16008 20137 20523 21172 23970 25157 25430 25759
7192 13142 15433 15507 15786 19229 19941 20456 20638 21009 25255 25838
678 1316 1858 5998 7537 8281 10923 15597 17389 18691 22102 25100
5819 6861 10626 10992 11039 13808 16495 16523 17437 20789 23463 24419
468 1289 4394 10112 10247 11168 15397 22042 22099 24220 24531 25142
1558 3264 3909 4121 6949 7547 9255 9428 9978 14409 19324 23040
3270 7693 10988 11129 12729 13188 13226 13386 17316 17549 21330 23577
924 3985 7216 8509 8931 9366 13032 17083 17111 19413 24966 24970
2589 7528 14343 15335 16060 17746 18259 20225 21262 23463 23524 25807
13718 18101 23423
3179 16321 23323
11120 14943 15049
10879 19035 21668
2393 8558 22850
6706 19748 24659
10136 15125 20390
9513 15535 18696
3964 5032 12598
10242 23055 25367
650 7353 20597
3162 11002 23839
2153 3077 20395
683 1000 13632
13182 17324 21766
5786 9155 19620
8529 11438 17005
217 5946 25640
6123 9532 17184
8975 10931 16954
14656 16394 22092
6145 13246 22376
18444 18915 21312
2115 14365 24194
11032 18236 20659
14486 22575 24669
15679 20943 25653
6881 7592 20934
777 14645 22876
8470 11263 17125
11159 22718 24692
18809 22677 23161
6430 15890 19898
10721 15342 19263
637 12008 19972
3327 14142 17132
6626 8278 17470
579 20337 25099
3141 13081 14315
9504 17357 23204
16253 20890 24073
1876 16146 21682
5310 5571 22570
17297 19348 19472
7100 13243 18153
8567 16070 17399
4279 13069 20035
14532 22925 25387
```

-continued

```
3579 4166 12336
108 2130 7119
12189 13790 16122
12757 16705 25768
372 8248 18808
3107 10254 19423
3839 22965 23458
545 3895 10707
5271 11433 21752
798 1056 17532
471 754 15973
1425 11664 23858
20057 20639 21091
13907 14433 19007
16080 20032 24955
1398 14507 19154
6916 17780 24110
416 16393 17534
9800 10659 22341
13674 17377 17743
163 13792 19756
1421 12948 19238
2714 19233 25264
3113 15257 24463
2182 2532 9118
8647 12629 16846
3275 17252 18700
3529 18768 20538
2290 9906 11818
824 2180 10139
12309 17149 25813
2093 5279 20214
3843 19791 25029.
```

10. A method for encoding a channel in a communication system using a Low-Density Parity-Check (LDPC) code, comprising the steps of:

reading a stored parity-check matrix; and

LDPC-encoding a signal using the stored parity-check matrix;

wherein a code rate is ⅔ and a length of a codeword is 64800, the parity-check matrix is formed as defined in the following table:

```
2599 2998 3291 3793 4567 5644 7476 8945 9250 11630 12041 12344 19983
113 5946 6640 7426 7577 10233 10831 12335 15672 15976 17995 20152 20514
1944 3315 4168 6117 6661 8745 10508 10608 10821 11636 12212 15145 19082
5549 7899 10946 11962 12090 17083 17847 18440 19631 20039 20089 20589 21258
239 3726 7468 7981 10028 11317 12462 15272 17747 19262 19403 20174 21514
563 2018 3439 4693 5458 7056 9391 9665 9832 10569 13076 14598 18340
467 5607 5665 6934 8062 9706 10101 10572 12288 15067 16083 17520 20906
311 1489 2790 3597 14820 15231 15255 15398 17333 18042 18224 18680 19454
2399 4145 4176 4659 6197 11205 12514 12620 17261 17928 20292 21384 21442
2716 3794 6478 7567 10083 10345 10541 13543 16561 16638 17876 19459 19487
2034 3004 6284 9100 11606 12393 13821 14548 14731 15790 16208 19442 21095
695 895 3606 5787 6673 7232 7357 7546 13517 14409 17631 18089 18109
1871 17078 17635
650 3495 19537
13253 14562 21465
17010 18503 21534    4877 11066 14567    13694 17241 18609    8463 14331 19453
772 8760 14044       2450 8146 19442     3449 6960 19670     839 6233 11080
15796 17669 19353    9466 10514 20733    5801 8809 15536     1398 10270 18705
4303 9339 12774      3696 5116 15388     243 3130 11099      2097 4649 11467
9864 10810 18992     681 12437 13196     7141 8258 9684      3530 11143 16025
1649 11507 16359     4638 5334 16260     10462 13945 14037   11515 16902 19208
530 11504 17421      285 11341 19088     15496 17464 21164   573 12521 13333
3374 3415 20944      9653 12212 16078    11019 13382 21452   6803 19726 21100
7387 9000 18446      16837 19451 20524   2616 4435 18743     3732 7141 21140
4196 15198 17373     5063 6192 12109     5781 6528 20818     9088 9274 20868
1283 9297 11956      18458 18909 20899   3847 12353 14717    4396 8334 19189
252 7903 13630       2812 11226 11554    2812 13350 17336    6532 7897 14387
14813 16449 17397    6067 6800 15459     3555 4328 11051     1824 15244 17730
5399 12210 17848     11692 15205 17475   12410 14455 20434   4762 5874 7472
7808 10729 11165     1587 4410 5230      786 2520 19841      12831 17338 19527
9580 13910 15084     10333 12223 14508   743 4509 16724      1563 14138 14357
5317 6901 10368      2411 3354 14871     3467 8048 18092     13411 15600 20409
1802 8681 17498      2074 5744 16166     7858 10998 13344    3199 10422 11726
8593 12546 13042     16627 18444 19813   4775 10872 19350    889 7870 17425
679 5175 14436       3629 10662 13143    5581 7407 21485     1995 3599 14195
```

-continued

| | | | |
|---|---|---|---|
| 875 10551 10785 | 1475 15605 15767 | 2318 5722 19708 | 15764 18173 19022 |
| 2905 13651 20802 | 4699 5500 18891 | 8840 12796 21166 | 3956 15311 20379 |
| 1414 4143 14967 | 4912 8900 19663 | 4248 14884 21559 | 2069 3014 20265 |
| 3440 9659 13315 | 2206 4451 19926 | 9362 13645 17616 | 3366 7956 9681 |
| 3811 8441 16858 | 6867 9153 13395 | 703 4291 11777 | |
| 3702 6622 16595 | 1392 8008 21198 | 219 13646 18614 | |
| 5825 8937 17080 | 637 4951 12585 | 3537 14257 17073. | |

11. The method of claim 8, wherein the parity-check matrix has a plurality of column groups provided by grouping columns corresponding to the information word, each column group having a predetermined number of columns; and
wherein each row in the table includes sequence information indicating positions of rows where '1' is located in a corresponding column group of the parity-check matrix.

12. A method for decoding a channel in a communication system using a Low-Density Parity-Check (LDPC) code, comprising the steps of:
extracting a parity-check matrix of the LDPC code; and
performing LDPC decoding using the extracted parity-check matrix;
wherein a code rate is ⅗ and a length of a codeword is 16200, the parity-check matrix is formed as defined in the following table:

71 1478 1901 2240 2649 2725 3592 3708 3965 4080 5733 6198
393 1384 1435 1878 2773 3182 3586 5465 6091 6110 6114 6327
160 1149 1281 1526 1566 2129 2929 3095 3223 4250 4276 4612
289 1446 1602 2421 3559 3796 5590 5750 5763 6168 6271 6340
947 1227 2008 2020 2266 3365 3588 3867 4172 4250 4865 6290
3324 3704 4447
1206 2565 3089
529 4027 5891
141 1187 3206
1990 2972 5120
752 796 5976
1129 2377 4030
6077 6108 6231

-continued 61 1053 1781
2820 4109 5307
2088 5834 5988
3725 3945 4010
1081 2780 3389
659 2221 4822
3033 6060 6160
756 1489 2350
3350 3624 5470
357 1825 5242
585 3372 6062
561 1417 2348
971 3719 5567
1005 1675 2062.

13. The method of claim 12, wherein the parity-check matrix has a plurality of column groups provided by grouping columns corresponding the information word, each column group having a predetermined number of columns; and
wherein each row in the table includes sequence information indicating positions of rows where '1' is located in a corresponding column group of the parity-check matrix.

14. A method for decoding a channel in a communication system using a Low-Density Parity-Check (LDPC) code, comprising the steps of:
extracting a parity-check matrix of the LDPC code; and
performing LDPC decoding using the extracted parity-check matrix;
wherein a code rate is ⅗ and a length of a codeword is 64800, the parity-check matrix is formed as defined in the following table:

1096 5305 7922 9029 9900 11901 13025 13052 13129 13325 13655 14723
1394 1860 6369 7264 8430 9676 10812 15647 18305 23208 23745 23826
770 2568 3964 5173 6526 6920 7003 10710 12819 15549 16488 25759
51 693 3004 9322 10614 11173 14481 15351 17204 24347 24595 25066
5823 6733 8535 11633 12278 13266 14804 16227 18147 21946 22918 25486
3435 3718 4487 4955 5256 8584 12007 13417 14215 17230 19400 20982
844 1833 6682 6715 7028 9774 10242 16051 18866 22429 23751 24727
330 1481 2318 3851 4719 5306 11620 11809 13829 13992 19885 25341
2231 3656 4723 7860 12123 13390 16365 17923 19086 23028 23324 23984
515 3130 13252 14250 16261 16907 18400 18900 20512 22911 23030 23761
4449 6633 13133 16253 20114 21157 21213 21287 23287 23942 24401 24811
1365 1560 2416 3866 4743 6641 12645 12802 13978 21478 22017 22564
996 1168 2095 2393 2846 4283 10876 11528 12414 15516 19867 23249
2278 3803 3922 8045 10512 11485 11605 13057 19340 21857 21971 23766
2252 3454 5978 6040 8378 11319 12461 13080 16013 19436 20070 22569
2346 2879 7004 8175 8227 8589 8850 9291 12756 15786 16971 23159
81 1790 1976 3361 7529 7902 8299 11663 13327 14484 16468 20032
1284 3267 3647 4207 4834 5596 9554 11103 16921 20328 20697 23312
890 10978 12966 13432 16008 20137 20523 21172 23970 25157 25430 25759
7192 13142 15433 15507 15786 19229 19941 20456 20638 21009 25255 25838
678 1316 1858 5998 7537 8281 10923 15597 17389 18691 22102 25100
5819 6861 10626 10992 11039 13808 16495 16523 17437 20789 23463 24419
468 1289 4394 10112 10247 11168 15397 22042 22099 24220 24531 25142
1558 3264 3909 4121 6949 7547 9255 9428 9978 14409 19324 23040
3270 7693 10988 11129 12729 13188 13226 13386 17316 17549 21330 23577
924 3985 7216 8509 8931 9366 13032 17083 17111 19413 24966 24970
2589 7528 14343 15335 16060 17746 18259 20225 21262 23463 23524 25807
13718 18101 23423
3179 16321 23323

-continued 11120 14943 15049
10879 19035 21668
2393 8558 22850
6706 19748 24659
10136 15125 20390
9513 15535 18696
3964 5032 12598
10242 23055 25367
650 7353 20597
3162 11002 23839
2153 3077 20395
683 1000 13632
13182 17324 21766
5786 9155 19620
8529 11438 17005
217 5946 25640
6123 9532 17184
8975 10931 16954
14656 16394 22092
6145 13246 22376
18444 18915 21312
2115 14365 24194
11032 18236 20659
14486 22575 24669
15679 20943 25653
6881 7592 20934
777 14645 22876
8470 11263 17125
11159 22718 24692
18809 22677 23161
6430 15890 19898
10721 15342 19263
637 12008 19972
3327 14142 17132
6626 8278 17470
579 20337 25099
3141 13081 14315
9504 17357 23204
16253 20890 24073
1876 16146 21682
5310 5571 22570
17297 19348 19472
7100 13243 18153
8567 16070 17399
4279 13069 20035
14532 22925 25387
3579 4166 12336
108 2130 7119
12189 13790 16122
12757 16705 25768
372 8248 18808
3107 10254 19423
3839 22965 23458
545 3895 10707
5271 11433 21752
798 1056 17532
471 754 15973
1425 11664 23858
20057 20639 21091
13907 14433 19007
16080 20032 24955
1398 14507 19154
6916 17780 24110
416 16393 17534
9800 10659 22341
13674 17377 17743
163 13792 19756
1421 12948 19238
2714 19233 25264
3113 15257 24463
2182 2532 9118
8647 12629 16846
3275 17252 18700
3529 18768 20538
2290 9906 11818
824 2180 10139
12309 17149 25813
2093 5279 20214
3843 19791 25029.

15. A method for decoding a channel in a communication system using a Low-Density Parity-Check (LDPC) code, comprising the steps of:
  extracting a parity-check matrix of the LDPC code; and
  performing LDPC decoding using the extracted parity-check matrix;
  wherein a code rate is ⅔ and a length of a codeword is 64800, the parity-check matrix is formed as defined in the following table:

```
2599 2998 3291 3793 4567 5644 7476 8945 9250 11630 12041 12344 19983
113 5946 6640 7426 7577 10233 10831 12335 15672 15976 17995 20152 20514
1944 3315 4168 6117 6661 8745 10508 10608 10821 11636 12212 15145 19082
5549 7899 10946 11962 12090 17083 17847 18440 19631 20039 20089 20589 21258
239 3726 7468 7981 10028 11317 12462 15272 17747 19262 19403 20174 21514
563 2018 3439 4693 5458 7056 9391 9665 9832 10569 13076 14598 18340
467 5607 5665 6934 8062 9706 10101 10572 12288 15067 16083 17520 20906
311 1489 2790 3597 14820 15231 15255 15398 17333 18042 18224 18680 19454
2399 4145 4176 4659 6197 11205 12514 12620 17261 17928 20292 21384 21442
2716 3794 6478 7567 10083 10345 10541 13543 16561 16638 17876 19459 19487
2034 3004 6284 9100 11606 12393 13821 14548 14731 15790 16208 19442 21095
695 895 3606 5787 6673 7232 7357 7546 13517 14409 17631 18089 18109
1871 17078 17635
650 3495 19537
13253 14562 21465
17010 18503 21534    4877 11066 14567    13694 17241 18609    8463 14331 19453
772 8760 14044       2450 8146 19442     3449 6960 19670     839 6233 11080
15796 17669 19353    9466 10514 20733    5801 8809 15536     1398 10270 18705
4303 9339 12774      3696 5116 15388     243 3130 11099      2097 4649 11467
9864 10810 18992     681 12437 13196     7141 8258 9684      3530 11143 16025
1649 11507 16359     4638 5334 16260     10462 13945 14037   11515 16902 19208
530 11504 17421      285 11341 19088     15496 17464 21164   573 12521 13333
3374 3415 20944      9653 12212 16078    11019 13382 21452   6803 19726 21100
7387 9000 18446      16837 19451 20524   2616 4435 18743     3732 7141 21140
4196 15198 17373     5063 6192 12109     5781 6528 20818     9088 9274 20868
1283 9297 11956      18458 18909 20899   3847 12353 14717    4396 8334 19189
252 7903 13630       2812 11226 11554    2812 13350 17336    6532 7897 14387
14813 16449 17397    6067 6800 15459     3555 4328 11051     1824 15244 17730
5399 12210 17848     11692 15205 17475   12410 14455 20434   4762 5874 7472
7808 10729 11165     1587 4410 5230      786 2520 19841      12831 17338 19527
9580 13910 15084     10333 12223 14508   743 4509 16724      1563 14138 14357
5317 6901 10368      2411 3354 14871     3467 8048 18092     13411 15600 20409
1802 8681 17498      2074 5744 16166     7858 10998 13344    3199 10422 11726
8593 12546 13042     16627 18444 19813   4775 10872 19350    889 7870 17425
679 5175 14436       3629 10662 13143    5581 7407 21485     1995 3599 14195
875 10551 10785      1475 15605 15767    2318 5722 19708     15764 18173 19022
2905 13651 20802     4699 5500 18891     8840 12796 21166    3956 15311 20379
1414 4143 14967      4912 8900 19663     4248 14884 21559    2069 3014 20265
3440 9659 13315      2206 4451 19926     9362 13645 17616    3366 7956 9681
3811 8441 16858      6867 9153 13395     703 4291 11777
3702 6622 16595      1392 8008 21198     219 13646 18614
5825 8937 17080      637 4951 12585      3537 14257 17073.
```

```
529 4027 5891
141 1187 3206
1990 2972 5120
752 796 5976
1129 2377 4030
6077 6108 6231
61 1053 1781
```

16. An apparatus for encoding a channel in a communication system using a Low-Density Parity-Check (LDPC) code, comprising:
  an LDPC code parity-check matrix extractor for reading a stored parity-check matrix; and
  an LDPC encoder for LDPC-encoding a received signal using the stored parity-check matrix;
  wherein a code rate is ⅗ and a length of a codeword is 16200, the parity-check matrix is formed as defined in the following table:

```
71 1478 1901 2240 2649 2725 3592 3708 3965 4080 5733 6198
393 1384 1435 1878 2773 3182 3586 5465 6091 6110 6114 6327
160 1149 1281 1526 1566 2129 2929 3095 3223 4250 4276 4612
289 1446 1602 2421 3559 3796 5590 5750 5763 6168 6271 6340
947 1227 2008 2020 2266 3365 3588 3867 4172 4250 4865 6290
3324 3704 4447
1206 2565 3089
```

```
2820 4109 5307
2088 5834 5988
3725 3945 4010
1081 2780 3389
659 2221 4822
3033 6060 6160
756 1489 2350
3350 3624 5470
357 1825 5242
585 3372 6062
561 1417 2348
971 3719 5567
1005 1675 2062.
```

17. The apparatus of claim 16, wherein the parity-check matrix has a plurality of column groups provided by grouping columns corresponding the information word, each column group having a predetermined number of columns; and wherein each row in the table includes sequence information indicating positions of rows where '1' is located in a corresponding column group of the parity-check matrix.

18. An apparatus for encoding a channel in a communication system using a Low-Density Parity-Check (LDPC) code, comprising:

an LDPC code parity-check matrix extractor for reading a stored parity-check matrix; and
an LDPC encoder for LDPC-encoding a received signal using the stored parity-check matrix;
wherein a code rate is $3/5$ and a length of a codeword is 64800, the parity-check matrix is formed as defined in the following table:

---

1096 5305 7922 9029 9900 11901 13025 13052 13129 13325 13655 14723
1394 1860 6369 7264 8430 9676 10812 15647 18305 23208 23745 23826
770 2568 3964 5173 6526 6920 7003 10710 12819 15549 16488 25759
51 693 3004 9322 10614 11173 14481 15351 17204 24347 24595 25066
5823 6733 8535 11633 12278 13266 14804 16227 18147 21946 22918 25486
3435 3718 4487 4955 5256 8584 12007 13417 14215 17230 19400 20982
844 1833 6682 6715 7028 9774 10242 16051 18866 22429 23751 24727
330 1481 2318 3851 4719 5306 11620 11809 13829 13992 19885 25341
2231 3656 4723 7860 12123 13390 16365 17923 19086 23028 23324 23984
515 3130 13252 14250 16261 16907 18400 18900 20512 22911 23030 23761
4449 6633 13133 16253 20114 21157 21213 21287 23287 23942 24401 24811
1365 1560 2416 3866 4743 6641 12645 12802 13978 21478 22017 22564
996 1168 2095 2393 2846 4283 10876 11528 12414 15516 19867 23249
2278 3803 3922 8045 10512 11485 11605 13057 19340 21857 21971 23766
2252 3454 5978 6040 8378 11319 12461 13080 16013 19436 20070 22569
2346 2879 7004 8175 8227 8589 8850 9291 12756 15786 16971 23159
81 1790 1976 3361 7529 7902 8299 11663 13327 14484 16468 20032
1284 3267 3647 4207 4834 5596 9554 11103 16921 20328 20697 23312
890 10978 12966 13432 16008 20137 20523 21172 23970 25157 25430 25759
7192 13142 15433 15507 15786 19229 19941 20456 20638 21009 25255 25838
678 1316 1858 5998 7537 8281 10923 15597 17389 18691 22102 25100
5819 6861 10626 10992 11039 13808 16495 16523 17437 20789 23463 24419
468 1289 4394 10112 10247 11168 15397 22042 22099 24220 24531 25142
1558 3264 3909 4121 6949 7547 9255 9428 9978 14409 19324 23040
3270 7693 10988 11129 12729 13188 13226 13386 17316 17549 21330 23577
924 3985 7216 8509 8931 9366 13032 17083 17111 19413 24966 24970
2589 7528 14343 15335 16060 17746 18259 20225 21262 23463 23524 25807
13718 18101 23423
3179 16321 23323
11120 14943 15049
10879 19035 21668
2393 8558 22850
6706 19748 24659
10136 15125 20390
9513 15535 18696
3964 5032 12598
10242 23055 25367
650 7353 20597
3162 11002 23839
2153 3077 20395
683 1000 13632
13182 17324 21766
5786 9155 19620
8529 11438 17005
217 5946 25640
6123 9532 17184
8975 10931 16954
14656 16394 22092
6145 13246 22376
18444 18915 21312
2115 14365 24194
11032 18236 20659
14486 22575 24669
15679 20943 25653
6881 7592 20934
777 14645 22876
8470 11263 17125
11159 22718 24692
18809 22677 23161
6430 15890 19898
10721 15342 19263
637 12008 19972
3327 14142 17132
6626 8278 17470
579 20337 25099
3141 13081 14315
9504 17357 23204
16253 20890 24073
1876 16146 21682
5310 5571 22570

-continued

```
17297 19348 19472
7100 13243 18153
8567 16070 17399
4279 13069 20035
14532 22925 25387
3579 4166 12336
108 2130 7119
12189 13790 16122
12757 16705 25768
372 8248 18808
3107 10254 19423
3839 22965 23458
545 3895 10707
5271 11433 21752
798 1056 17532
471 754 15973
1425 11664 23858
20057 20639 21091
13907 14433 19007
16080 20032 24955
1398 14507 19154
6916 17780 24110
416 16393 17534
9800 10659 22341
13674 17377 17743
163 13792 19756
1421 12948 19238
2714 19233 25264
3113 15257 24463
2182 2532 9118
8647 12629 16846
3275 17252 18700
3529 18768 20538
2290 9906 11818
824 2180 10139
12309 17149 25813
2093 5279 20214
3843 19791 25029.
```

19. An apparatus for encoding a channel in a communication system using a Low-Density Parity-Check (LDPC) code, comprising:
  an LDPC code parity-check matrix extractor for reading a stored parity-check matrix; and
  an LDPC encoder for LDPC-encoding a received signal using the stored parity-check matrix;
  wherein a code rate is ⅔ and a length of a codeword is 64800, the parity-check matrix is formed as defined in the following table:

```
2599 2998 3291 3793 4567 5644 7476 8945 9250 11630 12041 12344 19983
113 5946 6640 7426 7577 10233 10831 12335 15672 15976 17995 20152 20514
1944 3315 4168 6117 6661 8745 10508 10608 10821 11636 12212 15145 19082
5549 7899 10946 11962 12090 17083 17847 18440 19631 20039 20089 20589 21258
239 3726 7468 7981 10028 11317 12462 15272 17747 19262 19403 20174 21514
563 2018 3439 4693 5458 7056 9391 9665 9832 10569 13076 14598 18340
467 5607 5665 6934 8062 9706 10101 10572 12288 15067 16083 17520 20906
311 1489 2790 3597 14820 15231 15255 15398 17333 18042 18224 18680 19454
2399 4145 4176 4659 6197 11205 12514 12620 17261 17928 20292 21384 21442
2716 3794 6478 7567 10083 10345 10541 13543 16561 16638 17876 19459 19487
2034 3004 6284 9100 11606 12393 13821 14548 14731 15790 16208 19442 21095
695 895 3606 5787 6673 7232 7357 7546 13517 14409 17631 18089 18109
1871 17078 17635
650 3495 19537
13253 14562 21465
17010 18503 21534    4877 11066 14567    13694 17241 18609    8463 14331 19453
772 8760 14044       2450 8146 19442     3449 6960 19670     839 6233 11080
15796 17669 19353    9466 10514 20733    5801 8809 15536     1398 10270 18705
4303 9339 12774      3696 5116 15388     243 3130 11099      2097 4649 11467
9864 10810 18992     681 12437 13196     7141 8258 9684      3530 11143 16025
1649 11507 16359     4638 5334 16260     10462 13945 14037   11515 16902 19208
530 11504 17421      285 11341 19088     15496 17464 21164   573 12521 13333
3374 3415 20944      9653 12212 16078    11019 13382 21452   6803 19726 21100
7387 9000 18446      16837 19451 20524   2616 4435 18743     3732 7141 21140
4196 15198 17373     5063 6192 12109     5781 6528 20818     9088 9274 20868
1283 9297 11956      18458 18909 20899   3847 12353 14717    4396 8334 19189
252 7903 13630       2812 11226 11554    2812 13350 17336    6532 7897 14387
14813 16449 17397    6067 6800 15459     3555 4328 11051     1824 15244 17730
5399 12210 17848     11692 15205 17475   12410 14455 20434   4762 5874 7472
7808 10729 11165     1587 4410 5230      786 2520 19841      12831 17338 19527
```

| | | | |
|---|---|---|---|
| 9580 13910 15084 | 10333 12223 14508 | 743 4509 16724 | 1563 14138 14357 |
| 5317 6901 10368 | 2411 3354 14871 | 3467 8048 18092 | 13411 15600 20409 |
| 1802 8681 17498 | 2074 5744 16166 | 7858 10998 13344 | 3199 10422 11726 |
| 8593 12546 13042 | 16627 18444 19813 | 4775 10872 19350 | 889 7870 17425 |
| 679 5175 14436 | 3629 10662 13143 | 5581 7407 21485 | 1995 3599 14195 |
| 875 10551 10785 | 1475 15605 15767 | 2318 5722 19708 | 15764 18173 19022 |
| 2905 13651 20802 | 4699 5500 18891 | 8840 12796 21166 | 3956 15311 20379 |
| 1414 4143 14967 | 4912 8900 19663 | 4248 14884 21559 | 2069 3014 20265 |
| 3440 9659 13315 | 2206 4451 19926 | 9362 13645 17616 | 3366 7956 9681 |
| 3811 8441 16858 | 6867 9153 13395 | 703 4291 11777 | |
| 3702 6622 16595 | 1392 8008 21198 | 219 13646 18614 | |
| 5825 8937 17080 | 637 4951 12585 | 3537 14257 17073. | |

20. An apparatus for decoding a channel in a communication system using a Low-Density Parity-Check (LDPC) code, comprising:
   an LDPC code parity-check matrix extractor for reading a stored parity-check matrix; and
   an LDPC decoder for performing LDPC decoding using the read parity-check matrix;
   wherein a code rate is ⅗ and a length of a codeword is 16200, the read parity-check matrix is formed as defined in the following table:

```
71 1478 1901 2240 2649 2725 3592 3708 3965 4080 5733 6198
393 1384 1435 1878 2773 3182 3586 5465 6091 6110 6114 6327
160 1149 1281 1526 1566 2129 2929 3095 3223 4250 4276 4612
289 1446 1602 2421 3559 3796 5590 5750 5763 6168 6271 6340
947 1227 2008 2020 2266 3365 3588 3867 4172 4250 4865 6290
3324 3704 4447
1206 2565 3089
529 4027 5891
141 1187 3206
1990 2972 5120
752 796 5976
1129 2377 4030
6077 6108 6231
61 1053 1781
2820 4109 5307
2088 5834 5988
3725 3945 4010
1081 2780 3389
```

-continued

```
659 2221 4822
3033 6060 6160
756 1489 2350
3350 3624 5470
357 1825 5242
585 3372 6062
561 1417 2348
971 3719 5567
1005 1675 2062.
```

21. The apparatus of claim 20, wherein the parity-check matrix has a plurality of column groups provided by grouping columns corresponding the information word, each column group having a predetermined number of columns; and
   wherein each row in the table includes sequence information indicating positions of rows where '1' is located in a corresponding column group of the parity-check matrix.

22. An apparatus for decoding a channel in a communication system using a Low-Density Parity-Check (LDPC) code, comprising:
   an LDPC code parity-check matrix extractor for reading a stored parity-check matrix; and
   an LDPC decoder for performing LDPC decoding using the read parity-check matrix;
   wherein a code rate is ⅗ and a length of a codeword is 64800, the read parity-check matrix is formed as defined in the following table:

```
1096 5305 7922 9029 9900 11901 13025 13052 13129 13325 13655 14723
1394 1860 6369 7264 8430 9676 10812 15647 18305 23208 23745 23826
770 2568 3964 5173 6526 6920 7003 10710 12819 15549 16488 25759
51 693 3004 9322 10614 11173 14481 15351 17204 24347 24595 25066
5823 6733 8535 11633 12278 13266 14804 16227 18147 21946 22918 25486
3435 3718 4487 4955 5256 8584 12007 13417 14215 17230 19400 20982
844 1833 6682 6715 7028 9774 10242 16051 18866 22429 23751 24727
330 1481 2318 3851 4719 5306 11620 11809 13829 13992 19885 25341
2231 3656 4723 7860 12123 13390 16365 17923 19086 23028 23324 23984
515 3130 13252 14250 16261 16907 18400 18900 20512 22911 23030 23761
4449 6633 13133 16253 20114 21157 21213 21287 23287 23942 24401 24811
1365 1560 2416 3866 4743 6641 12645 12802 13978 21478 22017 22564
996 1168 2095 2393 2846 4283 10876 11528 12414 15516 19867 23249
2278 3803 3922 8045 10512 11485 11605 13057 19340 21857 21971 23766
2252 3454 5978 6040 8378 11319 12461 13080 16013 19436 20070 22569
2346 2879 7004 8175 8227 8589 8850 9291 12756 15786 16971 23159
81 1790 1976 3361 7529 7902 8299 11663 13327 14484 16468 20032
1284 3267 3647 4207 4834 5596 9554 11103 16921 20328 20697 23312
890 10978 12966 13432 16008 20137 20523 21172 23970 25157 25430 25759
7192 13142 15433 15507 15786 19229 19941 20456 20638 21009 25255 25838
678 1316 1858 5998 7537 8281 10923 15597 17389 18691 22102 25100
5819 6861 10626 10992 11039 13808 16495 16523 17437 20789 23463 24419
468 1289 4394 10112 10247 11168 15397 22042 22099 24220 24531 25142
1558 3264 3909 4121 6949 7547 9255 9428 9978 14409 19324 23040
3270 7693 10988 11129 12729 13188 13226 13386 17316 17549 21330 23577
924 3985 7216 8509 8931 9366 13032 17083 17111 19413 24966 24970
```

-continued

```
2589 7528 14343 15335 16060 17746 18259 20225 21262 23463 23524 25807
13718 18101 23423
3179 16321 23323
11120 14943 15049
10879 19035 21668
2393 8558 22850
6706 19748 24659
10136 15125 20390
9513 15535 18696
3964 5032 12598
10242 23055 25367
650 7353 20597
3162 11002 23839
2153 3077 20395
683 1000 13632
13182 17324 21766
5786 9155 19620
8529 11438 17005
217 5946 25640
6123 9532 17184
8975 10931 16954
14656 16394 22092
6145 13246 22376
18444 18915 21312
2115 14365 24194
11032 18236 20659
14486 22575 24669
15679 20943 25653
6881 7592 20934
777 14645 22876
8470 11263 17125
11159 22718 24692
18809 22677 23161
6430 15890 19898
10721 15342 19263
637 12008 19972
3327 14142 17132
6626 8278 17470
579 20337 25099
3141 13081 14315
9504 17357 23204
16253 20890 24073
1876 16146 21682
5310 5571 22570
17297 19348 19472
7100 13243 18153
8567 16070 17399
4279 13069 20035
14532 22925 25387
3579 4166 12336
108 2130 7119
12189 13790 16122
12757 16705 25768
372 8248 18808
3107 10254 19423
3839 22965 23458
545 3895 10707
5271 11433 21752
798 1056 17532
471 754 15973
1425 11664 23858
20057 20639 21091
13907 14433 19007
16080 20032 24955
1398 14507 19154
6916 17780 24110
416 16393 17534
9800 10659 22341
13674 17377 17743
163 13792 19756
1421 12948 19238
2714 19233 25264
3113 15257 24463
2182 2532 9118
8647 12629 16846
3275 17252 18700
3529 18768 20538
2290 9906 11818
824 2180 10139
12309 17149 25813
```

-continued 2093 5279 20214
3843 19791 25029.

23. An apparatus for decoding a channel in a communication system using a Low-Density Parity-Check (LDPC) code, comprising:
an LDPC code parity-check matrix extractor for reading a stored parity-check matrix; and
an LDPC decoder for performing LDPC decoding using the read parity-check matrix;
wherein a code rate is ⅔ and a length of a codeword is 64800, the read parity-check matrix is formed as defined in the following table:

2599 2998 3291 3793 4567 5644 7476 8945 9250 11630 12041 12344 19983
113 5946 6640 7426 7577 10233 10831 12335 15672 15976 17995 20152 20514
1944 3315 4168 6117 6661 8745 10508 10608 10821 11636 12212 15145 19082
5549 7899 10946 11962 12090 17083 17847 18440 19631 20039 20089 20589 21258
239 3726 7468 7981 10028 11317 12462 15272 17747 19262 19403 20174 21514
563 2018 3439 4693 5458 7056 9391 9665 9832 10569 13076 14598 18340
467 5607 5665 6934 8062 9706 10101 10572 12288 15067 16083 17520 20906
311 1489 2790 3597 14820 15231 15255 15398 17333 18042 18224 18680 19454
2399 4145 4176 4659 6197 11205 12514 12620 17261 17928 20292 21384 21442
2716 3794 6478 7567 10083 10345 10541 13543 16561 16638 17876 19459 19487
2034 3004 6284 9100 11606 12393 13821 14548 14731 15790 16208 19442 21095
695 895 3606 5787 6673 7232 7357 7546 13517 14409 17631 18089 18109
1871 17078 17635
650 3495 19537
13253 14562 21465
17010 18503 21534      4877 11066 14567    13694 17241 18609    8463 14331 19453
772 8760 14044         2450 8146 19442     3449 6960 19670     839 6233 11080
15796 17669 19353      9466 10514 20733    5801 8809 15536     1398 10270 18705
4303 9339 12774        3696 5116 15388     243 3130 11099      2097 4649 11467
9864 10810 18992       681 12437 13196     7141 8258 9684      3530 11143 16025
1649 11507 16359       4638 5334 16260     10462 13945 14037   11515 16902 19208
530 11504 17421        285 11341 19088     15496 17464 21164   573 12521 13333
3374 3415 20944        9653 12212 16078    11019 13382 21452   6803 19726 21100
7387 9000 18446        16837 19451 20524   2616 4435 18743     3732 7141 21140
4196 15198 17373       5063 6192 12109     5781 6528 20818     9088 9274 20868
1283 9297 11956        18458 18909 20899   3847 12353 14717    4396 8334 19189
252 7903 13630         2812 11226 11554    2812 13350 17336    6532 7897 14387
14813 16449 17397      6067 6800 15459     3555 4328 11051     1824 15244 17730
5399 12210 17848       11692 15205 17475   12410 14455 20434   4762 5874 7472
7808 10729 11105       1587 4410 5230      786 2520 19841      12831 17338 19527
9580 13910 15084       10333 12223 14508   743 4509 16724      1563 14138 14357
5317 6901 10368        2411 3354 14871     3467 8048 18092     13411 15600 20409
1802 8681 17498        2074 5744 16166     7858 10998 13344    3199 10422 11726
8593 12546 13042       16627 18444 19813   4775 10872 19350    889 7870 17425
679 5175 14436         3629 10662 13143    5581 7407 21485     1995 3599 14195
875 10551 10785        1475 15605 15767    2318 5722 19708     15764 18173 19022
2905 13651 20802       4699 5500 18891     8840 12796 21166    3956 15311 20379
1414 4143 14967        4912 8900 19663     4248 14884 21559    2069 3014 20265
3440 9659 13315        2206 4451 19926     9362 13645 17616    3366 7956 9681
3811 8441 16858        6867 9153 13395     703 4291 11777
3702 6622 16595        1392 8008 21198     219 13646 18614
5825 8937 17080        637 4951 12585      3537 14257 17073.

\* \* \* \* \*